(12) United States Patent
Jiang et al.

(10) Patent No.: US 12,323,028 B2
(45) Date of Patent: Jun. 3, 2025

(54) MOTOR CONTROLLER WITH ANNULAR CIRCUIT LAYOUT, DRIVE ASSEMBLY AND VEHICLE

(71) Applicant: ZHUHAI ENPOWER ELECTRIC CO., LTD., Guangdong (CN)

(72) Inventors: Guibin Jiang, Guangdong (CN); Hongxin Liu, Guangdong (CN); Hongyu Li, Guangdong (CN); Biao Wei, Guangdong (CN); Lixiong Mo, Guangdong (CN)

(73) Assignee: ZHUHAI ENPOWER ELECTRIC CO., LTD., Zhuhai (CN)

( * ) Notice: Subject to any disclaimer, the term of this patent is extended or adjusted under 35 U.S.C. 154(b) by 577 days.

(21) Appl. No.: 17/832,935

(22) Filed: Jun. 6, 2022

(65) Prior Publication Data
US 2022/0320951 A1    Oct. 6, 2022

Related U.S. Application Data
(63) Continuation of application No. PCT/CN2020/128919, filed on Nov. 16, 2020.

(30) Foreign Application Priority Data

Dec. 6, 2019 (CN) ......................... 201911246844.3
Dec. 6, 2019 (CN) ......................... 201911246892.2
(Continued)

(51) Int. Cl.
*H02K 5/22* (2006.01)
*B60K 1/00* (2006.01)
(Continued)

(52) U.S. Cl.
CPC ............... *H02K 5/225* (2013.01); *B60K 1/00* (2013.01); *B60L 50/51* (2019.02); *H02K 3/50* (2013.01);
(Continued)

(58) Field of Classification Search
CPC .......... H02K 5/225; H02K 11/33; H02K 3/50; H02K 3/505; H02K 2203/09;
(Continued)

(56) References Cited

U.S. PATENT DOCUMENTS 7,737,582 B2 * 6/2010 Jabaji .................. B60R 16/03
307/126
9,586,615 B2 * 3/2017 Asao .................. H02K 11/33
(Continued)

FOREIGN PATENT DOCUMENTS

| CN | 202978783 U | 6/2013 |
|----|-------------|--------|
| CN | 103427532 A | 12/2013 |

(Continued)

OTHER PUBLICATIONS

International Search Report of PCT Patent Application No. PCT/CN2020/128919 issued on Jan. 27, 2021.

*Primary Examiner* — Terrance L Kenerly

(57) ABSTRACT

The present disclosure relates to the field of new energy, and provides a motor controller with an annular circuit layout, a drive assembly, and a vehicle. The motor controller includes a laminated busbar assembly and multiple power transistors, wherein the laminated busbar assembly a main circuit board, a positive electrode connection plate, a negative electrode connection plate, and a three-phase connection plate assembly. In the present disclosure, the main circuit board is provided with a connection position in a center thereof, and a control circuit position, a first soldering position, and a second soldering position, which are each annular and
(Continued)

arranged around the connection position in sequence, so that connection terminals are centrally arranged, and the central control circuit has a relatively large space. The annular circuit layout improves the structural coordination with the drive assembly.

22 Claims, 14 Drawing Sheets

(30) Foreign Application Priority Data

| Dec. 6, 2019 | (CN) | 201911247025.0 |
|---|---|---|
| Dec. 6, 2019 | (CN) | 201911247126.8 |
| Dec. 6, 2019 | (CN) | 201911247127.2 |
| Dec. 6, 2019 | (CN) | 201922178390.2 |
| Dec. 6, 2019 | (CN) | 201922178476.5 |
| Dec. 6, 2019 | (CN) | 201922178480.1 |
| Dec. 6, 2019 | (CN) | 201922178661.4 |
| Dec. 6, 2019 | (CN) | 201922178663.3 |
| Dec. 6, 2019 | (CN) | 201922180773.3 |

(51) Int. Cl.
| *B60L 50/51* | (2019.01) |
|---|---|
| *H02K 3/50* | (2006.01) |
| *H02K 11/33* | (2016.01) |
| *H02M 7/00* | (2006.01) |

(52) U.S. Cl.
CPC ............ *H02K 3/505* (2013.01); *H02K 11/33* (2016.01); *H02M 7/003* (2013.01); *H02K 2203/09* (2013.01); *H02K 2211/03* (2013.01)

(58) Field of Classification Search
CPC .... H02K 2211/03; H02M 7/003; B60L 50/51; B60L 1/00
See application file for complete search history.

(56) References Cited

U.S. PATENT DOCUMENTS

| 2006/0158049 | A1* | 7/2006 | Suzuki | H02K 11/33 |
|---|---|---|---|---|
| | | | | 310/68 R |
| 2012/0098366 | A1* | 4/2012 | Yamasaki | H02K 11/33 |
| | | | | 310/72 |
| 2012/0313467 | A1* | 12/2012 | Omae | B62D 5/0406 |
| | | | | 310/71 |

FOREIGN PATENT DOCUMENTS

| CN | 204792787 U | 11/2015 |
|---|---|---|
| CN | 205391921 U | 7/2016 |
| CN | 106602798 A | 4/2017 |
| CN | 207339480 U | 5/2018 |
| CN | 108667228 A | 10/2018 |
| CN | 209233672 U | 8/2019 |
| CN | 209299077 U | 8/2019 |
| CN | 209358322 U | 9/2019 |

* cited by examiner

MOTOR CONTROLLER WITH ANNULAR CIRCUIT LAYOUT, DRIVE ASSEMBLY AND VEHICLE

CROSS REFERENCE TO RELATED APPLICATIONS

The present disclosure is a Continuation application of PCT Application No. PCT/CN2020/128919 filed on Nov. 16, 2020, which claims priorities to Chinese Patent Application Nos. CN201911247127.2, CN201911247126.8, CN201911246892.2, CN201911246844.3, CN201911247025.0, CN201922178663.3, CN201922178661.4, CN201922178480.1, CN201922178476.5, CN201922180773.3, and CN201922178390.2, filed on Dec. 6, 2019, the entire disclosures of which are incorporated herein by reference.

TECHNICAL FIELD

The present disclosure relates to the field of new energy, and in particular to a motor controller with an annular circuit layout, a drive assembly, and a vehicle.

BACKGROUND

New energy vehicles are environmentally friendly and low-polluting because they do not use gasoline or diesel as fuel to produce power. With the vigorous promotion of new energy power generation technologies using water energy, wind energy, solar energy, and nuclear energy, new energy vehicles are gradually promoted. There are various types of new energy vehicles, including new energy electric cars, new energy electric buses, new energy electric trucks, new energy electric cleaning vehicles, new energy electric rail vehicles, new energy electric flying vehicles, and new energy electric shipping vehicles.

The new energy vehicle is generally equipped with batteries, a motor controller, a motor and power generation devices. Power transistors in the motor controller receive direct current (DC) output from the battery, and invert the DC into alternating current (AC) for outputting to the motor. The motor outputs a rotational driving force to drive the power generation devices, such as wheels and blades, thereby driving the vehicle to travel.

The drive assembly (i.e. the motor and the motor controller) in the vehicle can be integrated to reduce its footprint, so as to free up more space for passengers, batteries, etc. In the case where the motor and the motor controller are integrated, to achieve an efficient integration of the drive assembly, it is necessary to consider an optimization of connection structures and related layout between the motor and the motor controller, cooling of the motor and the motor controller, optimal layout of related electrical connection structures, and an easiness of assembly of related components.

SUMMARY

Technical Objectives

A first objective of the present disclosure is to provide a drive assembly, which is provided with annularly arranged power transistors and is capable of realizing integrated liquid cooling.

A second objective of the present disclosure is to provide a vehicle provided with the above drive assembly.

A third objective of the present disclosure is to provide a drive assembly provided with a highly integrated controller at a rear end in an axial direction of the drive assembly.

A fourth objective of the present disclosure is to provide a vehicle provided with the above drive assembly.

A fifth objective of the present disclosure is to provide a laminated busbar assembly featuring high assembly efficiency and a compact structure.

A sixth objective of the present disclosure is to provide a motor controller provided with the above laminated busbar assembly.

A seventh objective of the present disclosure is to provide a drive assembly provided with the above motor controller.

An eighth objective of the present disclosure is to provide a vehicle provided with the above drive assembly.

A ninth objective of the present disclosure is to provide a motor controller provided with a laminated busbar assembly laminated stably with capacitors.

A tenth objective of the present disclosure is to provide a drive assembly provided with the above motor controller.

An eleventh objective of the present disclosure is to provide a vehicle provided with the above drive assembly.

A twelfth objective of the present disclosure is to provide a three-phase terminal block, which optimizes a wiring layout by circumferentially distributed terminals.

A thirteenth objective of the present disclosure is to provide a drive assembly provided with the above three-phase terminal block.

A fourteenth objective of the present disclosure is to provide a vehicle provided with the above drive assembly.

A fifteenth objective of the present disclosure is to provide a holding member featuring an integral annular arrangement and easy assembly.

A sixteenth objective of the present disclosure is to provide a drive assembly provided with the above holding member.

A seventeenth objective of the present disclosure is to provide a vehicle provided with the above drive assembly.

An eighteenth objective of the present disclosure is to provide a motor controller with an annular circuit layout.

A nineteenth objective of the present disclosure is to provide a drive assembly provided with the above motor controller.

A twentieth objective of the present disclosure is to provide a vehicle provided with the above drive assembly.

A twenty-first objective of the present disclosure is to provide a drive assembly where a portion thereof passes through a circumferential wall thereof in a radial direction thereof to reduce a vertical dimension.

A twenty-second objective of the present disclosure is to provide a vehicle provided with the above drive assembly.

A twenty-third objective of the present disclosure is to provide a drive assembly provided with a motor mounting chamber with an end sealed by potting.

A twenty-fourth objective of the present disclosure is to provide a vehicle provided with the above drive assembly.

A twenty-fifth objective of the present disclosure is to provide a drive assembly which is provided with an intermediate partition wall that is capable of realizing liquid cooling.

A twenty-sixth objective of the present disclosure is to provide a vehicle provided with the above drive assembly.

A twenty-seventh objective of the present disclosure is to provide a drive assembly provided with a resolver with a compact layout.

A twenty-eighth objective of the present disclosure is to provide a vehicle provided with the above drive assembly.

Technical Solutions

In order to achieve the first objective of the present disclosure, the present disclosure provides a drive assembly provided with annularly arranged power transistors. The drive assembly includes a housing, a motor controller, a rotor, and a stator, wherein the housing is cylindrical, and is provided therein with a chamber along an axial direction of the housing; an inner wall of the housing is provided with a partition wall along a radial direction of the housing, the partition wall divides the chamber into a motor mounting chamber and a controller mounting chamber; the rotor is provided in the motor mounting chamber; the stator is provided in the motor mounting chamber, and is located outside the rotor; the motor controller is provided in the controller mounting chamber; an outer wall of the housing is provided with a liquid cooling channel which includes a motor cooling groove and a controller cooling groove that communicate with each other; the motor cooling groove is located on an outer wall of the motor mounting chamber, and the controller cooling groove is located on an outer wall of the controller mounting chamber; the motor controller includes a circuit board assembly and multiple power transistors; the multiple power transistors are provided at an outer circumference of the circuit board assembly, and are electrically connected with the circuit board assembly; and packages of the multiple power transistors are connected with an inner wall of the controller mounting chamber.

Further, the multiple power transistors may be evenly distributed along a circumferential direction of the controller mounting chamber.

Further, the inner wall of the controller mounting chamber may be provided with multiple heat-conducting surfaces which may be connected along a circumferential direction of the inner wall of the controller mounting chamber in sequence and may be respectively connected with the packages of the power transistors.

Further, a collision avoidance groove may be provided between every two adjacent heat-conducting surfaces.

Further, a heat-conducting sheet may be located between a package of the power transistor and a heat-conducting surface.

Further, the housing may be provided with a power transistor mounting groove at an inner side of the inner wall of the controller mounting chamber; the power transistor mounting groove may be annular; and the multiple power transistors may be located in the power transistor mounting groove.

Further, the drive assembly further may include a holding member which may be located in the power transistor mounting groove and abuts between a wall of the power transistor mounting groove and the power transistors.

Further, the drive assembly further may include a positioning frame; the positioning frame may include an annular base plate and multiple spacers; the multiple spacers may be provided on the annular base plate, and extend along an axial direction of the positioning frame; the multiple spacers may be distributed along a circumferential direction of the annular base plate; the positioning frame may be located in the power transistor mounting groove; and every one spacer may be located between two adjacent power transistors.

Further, the spacer may be provided with a T-shaped radial section.

In order to achieve the second objective of the present disclosure, the present disclosure provides a vehicle provided with the above drive assembly.

In order to achieve the third objective of the present disclosure, the present disclosure provides a drive assembly provided with a motor controller at a rear end in an axial direction of the drive assembly. The drive assembly includes a housing, a motor controller, a bearing, a rotor, and a stator, wherein the housing is cylindrical, and is provided therein with a chamber along the axial direction; an inner wall of the housing is provided with a partition wall along a radial direction of the housing, the partition wall divides the chamber into a motor mounting chamber and a controller mounting chamber; the bearing is provided on the partition wall; the rotor is provided in the motor mounting chamber, and is connected with the bearing; the stator is provided in the motor mounting chamber, and is located outside the rotor; the motor controller is provided in the controller mounting chamber; the drive assembly further includes three single-phase terminals, which pass through the partition wall and are connected between the motor controller and the stator; and projection planes of the three single-phase terminals perpendicular to the axial direction are located between a projection plane of the bearing perpendicular to the axial direction and a projection plane of the stator perpendicular to the axial direction.

Further, the partition wall may be provided with a mounting hole and a mounting ring wall extending toward the motor mounting chamber at an outer circumference of the mounting hole; the bearing may be provided inside the mounting ring wall; and the three single-phase terminals may be located at an outer circumference of the mounting ring wall.

Further, the three single-phase terminals may be located at an outer circumferential wall of the mounting ring wall; and the outer circumferential wall of the mounting ring wall may be provided with a first collision avoidance groove at each of the three single-phase terminals.

Further, the partition wall may be provided with three run-through connecting holes and three run-through fixing holes; the three connecting holes and the three fixing holes may be distributed alternately and evenly at intervals along an outer circumference of the bearing; and one single-phase terminal may pass through one connecting hole.

Further, a first end wall of the partition wall facing the motor mounting chamber may be provided with second collision avoidance grooves, which extends from the respective connecting holes to the stator.

Further, the drive assembly further may include a chamber cover, which covers the mounting hole.

Further, a second end wall of the partition wall facing the controller mounting chamber may be provided with fixing holes, and the chamber cover may be located at the second end wall side, and may be connected with the fixing holes.

Further, the drive assembly may include a three-phase terminal block; the three-phase terminal block may include a terminal block body and three single-phase terminals; the terminal block body may be cylindrical; the three single-phase terminals may be each arranged along an axial direction of the terminal block body, and may be arranged at an outer circumference of the terminal block body; the single-phase terminals each may be provided with a first terminal portion and a second terminal portion, which may be respectively located on two ends of the terminal block body along an axial direction thereof; and the first terminal portions may be connected with the stator, and the second terminal portions may be connected with the motor controller.

Further, an outer wall of the housing may be provided with a liquid cooling channel; the liquid cooling channel may include a motor cooling groove and a controller cooling groove that may communicate with each other; the motor cooling groove may be located on an outer wall of the motor mounting chamber, and the controller cooling groove may be located on an outer wall of the controller mounting chamber; the motor controller may include a circuit board assembly and multiple power transistors; the multiple power transistors may be provided at an outer circumference of the circuit board assembly, and may be electrically connected with the circuit board assembly; and packages of the multiple power transistors may be connected with an inner wall of the controller mounting chamber.

In order to achieve the fourth objective of the present disclosure, the present disclosure provides a vehicle provided with the above drive assembly.

In order to achieve the fifth objective of the present disclosure, the present disclosure provides a laminated busbar assembly. The laminated busbar assembly includes a main circuit board, a positive electrode connection plate, a negative electrode connection plate, and a three-phase connection plate assembly, wherein the main circuit board, the positive electrode connection plate, and the negative electrode connection plate each are circular; an outer edge of the positive electrode connection plate is circumferentially provided with multiple positive electrode pins, and an outer edge of the negative electrode connection plate is circumferentially provided with multiple negative electrode pins; the three-phase connection plate assembly includes three single-phase connection plates, which are fan-shaped or arcuate; an outer edge of each single-phase connection plate is provided with multiple single-phase pins in a circumferential direction of each single-phase connection plate; the main circuit board, the three-phase connection plate assembly, the negative electrode connection plate, and the positive electrode connection plate are laminated along an axial direction of the positive electrode connection plate; the three single-phase connection plates are coplanar; and the multiple positive electrode pins, the multiple negative electrode pins, and the multiple single-phase pins pass through the main circuit board and are electrically connected with the main circuit board.

Further, the multiple positive electrode pins, the multiple negative electrode pins, and the multiple single-phase pins may be arranged along a same circumferential direction.

Further, the outer edge of the negative electrode connection plate may be provided with first pin collision avoidance grooves, and the outer edge of each single-phase connection plate may be provided with second pin collision avoidance grooves; and the positive electrode pins may pass through the first pin collision avoidance grooves and the second pin collision avoidance grooves, and the negative electrode pins may pass through the second pin collision avoidance grooves.

Further, two adjacent single-phase pins may form a single-phase bridge arm pin group; and one single-phase bridge arm pin group, one positive electrode pin, and one negative electrode pin may be cyclically arranged in a circumferential direction of the laminated busbar assembly in sequence.

Further, a center of the positive electrode connection plate may be provided with a first collision avoidance hole and an inner edge of the positive electrode connection plate may be provided with positive electrode connection terminals; a center of the negative electrode connection plate may be provided with a second collision avoidance hole and an inner edge of the negative electrode connection plate may be provided with negative electrode connection terminals; the three single-phase connection plates may be each arcuate, and an inner edge of each of the three single-phase connection plates is provided with a single-phase connection terminal; the first collision avoidance hole may communicate with the second collision avoidance hole; projection planes of the positive electrode connection terminals, the negative electrode connection terminals, and the three single-phase connection terminals, which are perpendicular to an axial direction of the laminated busbar assembly, may be located inside a projection plane of the second collision avoidance hole which is perpendicular to the axial direction.

In order to achieve the sixth objective of the present disclosure, the present disclosure provides a motor controller provided with the above laminated busbar assembly.

Further, the motor controller may include multiple power transistors soldered at an outer circumference of the main circuit board; and the multiple power transistors may be distributed along a circumferential direction and may be located outside the three-phase connection plate assembly, the negative electrode connection plate, and the positive electrode connection plate along a radial direction thereof.

In order to achieve the seventh objective of the present disclosure, the present disclosure provides a motor controller provided with the above drive assembly.

Further, the drive assembly may include a housing, a bearing, a rotor, and a stator, wherein the housing may be cylindrical, and may be provided therein with a chamber along an axial direction of the housing; an inner wall of the housing may be provided with a partition wall along a radial direction of the housing, the partition wall divides the chamber into a motor mounting chamber and a controller mounting chamber; the bearing may be provided on the partition wall; the rotor may be provided in the motor mounting chamber, and may be connected with the bearing; the stator may be provided in the motor mounting chamber, and may be located outside the rotor; the motor controller may be provided in the controller mounting chamber; and the drive assembly further may include three single-phase terminals, which may pass through the partition wall and may be connected between the motor controller and the stator.

In order to achieve the eighth objective of the present disclosure, the present disclosure provides a vehicle provided with the above drive assembly.

In order to achieve the ninth objective of the present disclosure, the present disclosure provides a motor controller. The motor controller includes a laminated busbar assembly and multiple capacitors, wherein the laminated busbar assembly includes a main circuit board, a positive electrode connection plate, and a negative electrode connection plate; the positive electrode connection plate is a bottomed cylinder, which encloses a device accommodating space; an outer edge of the positive electrode connection plate is provided with multiple positive electrode pins in a circumferential direction of the positive electrode connection plate; the negative electrode connection plate is circular, and an outer edge thereof is provided with multiple negative electrode pins in a circumferential direction of the negative electrode connection plate; the negative electrode connection plate covers the device accommodating space; the main circuit board, the negative electrode connection plate, and the positive electrode connection plate are laminated in sequence along an axial direction of the motor controller; the multiple positive electrode pins and the multiple negative electrode pins pass through the main circuit board and are electrically connected with the main circuit board; and the multiple capacitors are provided in the device accommodating space, and are connected between the positive electrode connection plate and the negative electrode connection plate.

Further, the positive electrode connection plate may be provided with a first collision avoidance hole at a center thereof, an inner ring wall at an outer circumference of the first collision avoidance hole, an outer ring wall surrounding an outer circumference of the inner ring wall, and a bottom ring wall located and connected between the inner ring wall and the outer ring wall of the positive electrode connection plate; and the inner ring wall, the outer ring wall, and the bottom ring wall may enclose an annular device accommodating space, in which the multiple capacitors may be distributed circumferentially.

Further, the bottom ring wall may be provided with multiple first electrical contacts, which may be circumferentially distributed, and may be connected with positive electrodes of the capacitors, respectively; the negative electrode connection plate may be provided with multiple second electrical contacts, which may be circumferentially distributed and may be connected with negative electrodes of the capacitors, respectively.

Further, a center of the negative electrode connection plate may be provided with a second collision avoidance hole and an inner edge of the negative electrode connection plate may be provided with negative electrode connection terminals; the second collision avoidance hole may communicate with the first collision avoidance hole; an end portion of the inner ring wall closer to the negative electrode connection plate may be provided with supporting platforms; an inner edge of the positive electrode connection plate may be provided with positive electrode connection terminals; the negative electrode connection plate may be adjacent to the supporting platforms; and projection planes of the positive electrode connection terminals and the negative electrode connection terminals, which are perpendicular to an axial direction of the motor controller, may be located inside a projection plane of the second collision avoidance hole perpendicular to the axial direction.

Further, the motor controller further may include a mounting shell; the mounting shell may be a bottomed cylinder, a bottom of which may be provided with a positioning post assembly extending along the axial direction; the mounting shell may enclose a mounting and accommodating space in which the positive electrode connection plate, the negative electrode connection plate, and the multiple capacitors are provided; the main circuit board covers the mounting and accommodating space; and the positioning post assembly may pass through the positive electrode connection plate and the negative electrode connection plate, and may fit with the main circuit board for position limiting.

Further, the mounting shell may be provided with a third collision avoidance hole at a center thereof, and connection and fixing platforms are provided in the third collision avoidance hole; and the connection and fixing platforms each may be provided with a positive electrode connection position and a negative electrode connection position.

Further, the positioning post assembly may include multiple first positioning posts and multiple second positioning posts; the multiple first positioning posts may be distributed in a circumferential direction; the multiple second positioning posts may be distributed in a circumferential direction, and may be located outside the multiple first positioning posts; and the multiple first positioning posts and the multiple second positioning posts may pass through the positive electrode connection plate and the negative electrode connection plate respectively; and two adjacent first positioning posts and two adjacent second positioning posts which are respectively adjacent to the two adjacent first positioning posts may enclose a capacitor positioning space in which one capacitor is located.

Further, a connecting line of one first positioning post and one second positioning post adjacent thereto may pass through an axis of the mounting shell.

In order to achieve the tenth objective of the present disclosure, the present disclosure provides a drive assembly provided with the above motor controller.

In order to achieve the eleventh objective of the present disclosure, the present disclosure provides a vehicle provided with the above drive assembly.

In order to achieve the twelfth objective of the present disclosure, the present disclosure provides a three-phase terminal block. The three-phase terminal block includes a terminal block body and three single-phase terminals; the terminal block body is cylindrical; the three single-phase terminals each are arranged along an axial direction of the terminal block body, and are arranged at an outer circumference of the terminal block body; and the single-phase terminals each are provided with a first terminal portion and a second terminal portion, which are respectively located on two ends along an axial direction of the terminal block body.

Further, the terminal block body may be provided therein with a wiring groove; and on a projection plane of the terminal block body perpendicular to the axial direction, projection planes of the first terminal portions perpendicular to the axial direction may be located at an outer circumference of a projection plane of the wiring groove perpendicular to the axial direction, and projection planes of the second terminal portions perpendicular to the axial direction may be located inside the projection plane of the wiring groove perpendicular to the axial direction.

Further, the terminal block body may include a central ring portion, outer connecting portions, and inner connecting portions; the central ring portion is annular and encircles the wiring groove; the inner connecting portions each extend in the wiring groove from the central ring portion; the outer connecting portions each extend away from the wiring groove from the central ring portion; and the single-phase terminals may pass through the central ring portion, the first terminal portions may be located at the outer connecting portions, and the second terminal portions may be located at the inner connecting portions.

Further, the outer connecting portions and the first terminal portions may be located outside the central ring portion in the axial direction.

Further, the three single-phase terminals may be connected with the central ring portion, the outer connecting portions, and the inner connecting portions through a secondary injection molding process.

Further, each outer connecting portion may be provided with a shielding wall at an outer circumference of each first terminal portion.

Further, the wiring groove may be further provided therein with mounting portions, which may be respectively located beside the second terminal portions.

Further, a magnetic ring may be further provided at the outer circumference of the terminal block body.

In order to achieve the thirteenth objective of the present disclosure, the present disclosure provides a drive assembly provided with the above three-phase terminal block.

In order to achieve the fourteenth objective of the present disclosure, the present disclosure provides a vehicle provided with the above drive assembly.

In order to achieve the fifteenth objective of the present disclosure, the present disclosure provides an annular holding member. The annular holding member includes an annular base portion and multiple holding portions, wherein the multiple holding portions are distributed on the annular base portion in a circumferential direction thereof.

Further, the annular base portion may be sheet-like.

Further, the holding portions may be arc-shaped.

Further, the holding portions each may include a fixed portion and an abutting portion; the fixed portion may be connected with the annular base portion; and the abutting portion protrudes from the fixed portion toward an outer side of the annular base portion.

Further, the abutting portion may be arc-shaped, and protrudes toward the outside of the annular base portion.

Further, each holding portion further may include a free portion; the abutting portion may be located between the fixed portion and the free portion; and the fixed portion and the free portion may be located at a side of the abutting portion closer to an inner side thereof.

Further, a first slot extending along an axial direction of the holding member may be provided between two adjacent holding portions.

Further, two adjacent holding portions may form a device holding group; a second slot extending along the axial direction may be provided between every two adjacent device holding groups; and a length of the second slot along the axial direction may be greater than a length of the first slot along the axial direction.

In order to achieve the sixteenth objective of the present disclosure, the present disclosure provides a drive assembly provided with the above holding member.

In order to achieve the seventeenth objective of the present disclosure, the present disclosure provides a vehicle provided with the above drive assembly.

In order to achieve the eighteenth objective of the present disclosure, the present disclosure provides a motor controller. The motor controller includes a laminated busbar assembly and multiple power transistors, wherein the laminated busbar assembly includes a main circuit board, a positive electrode connection plate, a negative electrode connection plate, and a three-phase connection plate assembly; the main circuit board, the positive electrode connection plate, and the negative electrode connection plate are each circular; an outer edge of the positive electrode connection plate is provided with multiple positive electrode pins in a circumferential direction of the positive electrode connection plate, and an outer edge of the negative electrode connection plate is provided with multiple negative electrode pins in a circumferential direction of the negative electrode connection plate; the three-phase connection plate assembly includes three single-phase connection plates, which are each arcuate; an outer edge of each of the single-phase connection plates is provided with multiple single-phase pins in a circumferential direction of the each of the single-phase connection plates; a center of the positive electrode connection plate is provided with a first collision avoidance hole, and an inner edge of the positive electrode connection plate is provided with positive electrode connection terminals; a center of the negative electrode connection plate is provided with a second collision avoidance hole and an inner edge of the negative electrode connection plate is provided with negative electrode connection terminals; an inner edge of each of the single-phase connection plates is provided with a single-phase connection terminal; the main circuit board, the three-phase connection plate assembly, the negative electrode connection plate, and the positive electrode connection plate are laminated in sequence along an axial direction of the motor controller; the three single-phase connection plates are coplanar; the main circuit board is provided with a connection position, a control circuit position, a first soldering position, and a second soldering position; the connection position is located in a center of the main circuit board; the control circuit position surrounds the connection position; the first soldering position surrounds the control circuit position; the second soldering position surrounds the first soldering position; projection planes of the positive electrode connection terminals, the negative electrode connection terminals, and the single-phase connection terminals, which are perpendicular to the axial direction of the motor controller, are located inside a projection plane of the connection position perpendicular to the axial direction; the multiple positive electrode pins, the multiple negative electrode pins, and the multiple single-phase pins are electrically connected with the main circuit board at the first soldering position; and the multiple power transistors surround the main circuit board, and are electrically connected with the main circuit board at the second soldering position.

Further, the multiple power transistors may be evenly distributed along a same circumferential direction of the main circuit board.

Further, the multiple positive electrode pins, the multiple negative electrode pins, and the multiple single-phase pins may be arranged along a same circumferential direction of the main circuit board.

Further, the motor controller may include multiple capacitors, which may be located and connected between the negative electrode connection plate and the positive electrode connection plate.

Further, projection planes of the capacitors perpendicular to the axial direction may be located inside a projection plane of the control circuit position perpendicular to the axial direction.

Further, the three single-phase connection terminals may be circumferentially evenly distributed; and the motor controller further may include three Hall elements, which may be provided at the three single-phase connection terminals, respectively.

Further, one positive electrode connection terminal and one negative electrode connection terminal may be located between two adjacent single-phase connection terminals.

Further, the positive electrode connection plate may be provided with three positive electrode connection terminals, and the negative electrode connection plate may be provided with three negative electrode connection terminals; and the positive electrode connection terminal and the negative electrode connection terminal may be alternated circumferentially.

In order to achieve the nineteenth objective of the present disclosure, the present disclosure provides a drive assembly provided with the above motor controller.

In order to achieve the twentieth objective of the present disclosure, the present disclosure provides a vehicle provided with the above drive assembly.

In order to achieve the twenty-first objective of the present disclosure, the present disclosure provides a drive assembly. The drive assembly includes a housing, a motor controller, a rotor, and a stator, wherein the housing is cylindrical, and is provided therein with a chamber along an axial direction of the housing; an inner wall of the housing is provided with a partition wall along a radial direction of the housing, the partition wall divides the chamber into a motor mounting chamber and a controller mounting chamber; the rotor is provided in the motor mounting chamber; the stator is provided in the motor mounting chamber, and is located outside the rotor; the motor controller is provided in the controller mounting chamber, and is connected with the stator; a circumferential wall of the housing, located at the controller mounting chamber, is provided with a run-through connecting hole along the radial direction; the drive assembly further includes a connecting assembly; the connecting assembly includes a positive electrode connecting plate and a negative electrode connecting plate; both an inner connecting terminal portion of the positive electrode connecting plate and an inner connecting terminal portion of the negative electrode connecting plate are connected with the motor controller; the positive electrode connecting plate and the negative electrode connecting plate pass through the connecting hole; and the positive electrode connecting plate and the negative electrode connecting plate each are provided with an outer connecting terminal portion on an outer circumferential wall of the housing.

Further, the positive electrode connecting plate and/or the negative electrode connection plate may be sheet-like.

Further, the motor controller may be provided with three positive electrode connection terminals and three negative electrode connection terminals, the positive electrode connection terminal and the negative electrode connection terminal may be alternated circumferentially; the inner connecting terminal portion of the positive electrode connecting plate may include three positive electrode connecting portions, which may be connected with the three positive electrode connection terminals, respectively; and the inner connecting terminal portion of the negative electrode connecting plate may include three negative electrode connecting portions, which may be connected with the three negative electrode connection terminals, respectively.

Further, the inner connecting terminal portion of the positive electrode connecting plate further may include a positive electrode connecting base portion, and the three positive electrode connecting portions may be connected with and circumferentially evenly distributed on an outer edge of the positive electrode connecting base portion; and the inner connecting terminal portion of the negative electrode connecting plate further may include a negative electrode connecting base portion, and the three negative electrode connecting portions may be connected with and circumferentially evenly distributed on an outer edge of the negative electrode connecting base portion.

Further, the positive electrode connecting base portion and the negative electrode connecting base portion may be laminated on the motor controller along an axial direction of the housing.

Further, the three positive electrode connection terminals and the three negative electrode connection terminals may be located on a same radial plane; the negative electrode connecting base portion may be located between the positive electrode connecting base portion and the motor controller; the positive electrode connecting base portion and positive electrode connecting portions may form a first collision avoidance recess in which the negative electrode connecting base portion may be located; alternatively, the positive electrode connecting base portion may be located between the negative electrode connecting base portion and the motor controller, and the negative electrode connecting base portion and negative electrode connecting portions may form a second collision avoidance recess in which the positive electrode connecting base portion may be located.

Further, the connecting assembly further may include a connecting sleeve, which may be located in the controller mounting chamber and covers the positive electrode connecting plate and the negative electrode connecting plate.

Further, the connecting assembly further may include a connecting box, which may be connected with the outer circumferential wall of the housing located at the controller mounting chamber; an interior of the connecting box may communicate with the controller mounting chamber through the connecting hole; and both the outer connecting terminal portion of the positive electrode connection plate and the outer connecting terminal portion of the negative electrode connection plate extend into the connecting box.

Further, the drive assembly may be provided with a mounting orientation; and in a vertical direction of the mounting orientation, the housing may include a top portion and a bottom portion, and the connecting hole may be located between the top portion and the bottom portion of the housing.

In order to achieve the twenty-second objective of the present disclosure, the present disclosure provides a vehicle provided with the above drive assembly.

In order to achieve the twenty-third objective of the present disclosure, the present disclosure provides a drive assembly. The drive assembly includes a housing, a motor controller, a bearing, a rotor, and a stator, wherein the housing is provided therein with a chamber along an axial direction of the housing; an inner wall of the housing is provided with a partition wall along a radial direction of the housing, the partition wall divides the chamber into a motor mounting chamber and a controller mounting chamber; the bearing is provided on the partition wall; the rotor is provided in the motor mounting chamber, and is connected with the bearing; the stator is provided in the motor mounting chamber, and is located outside the rotor; the motor controller is provided in the controller mounting chamber; the drive assembly further includes three single-phase terminals; the single-phase terminals each are provided with a first terminal portion at one end in the motor mounting chamber and a second terminal portion at one end in the controller mounting chamber; the first terminal portions are connected with the stator, and the second terminal portions are connected with the motor controller; and an end surface of the partition wall facing the motor mounting chamber is filled with potting glue, which covers the first terminal portions.

Further, projection planes of the three first terminal portions perpendicular to an axial direction of the drive assembly may be located between a projection plane of the bearing perpendicular to the axial direction and a projection plane of the stator perpendicular to the axial direction.

Further, the partition wall may be provided with a mounting hole and a mounting ring wall extending toward the motor mounting chamber at an outer circumference of the mounting hole; the bearing may be provided inside the mounting ring wall; the three single-phase terminals may be located at an outer circumference of the mounting ring wall; and the potting glue may be filled between the mounting ring wall, the partition wall and the inner wall of the housing.

Further, the three single-phase terminals may be located at an outer circumferential wall of the mounting ring wall; and the outer circumferential wall of the mounting ring wall may be provided with a first collision avoidance groove at each of the three single-phase terminals.

Further, the partition wall may be provided with three run-through connecting holes and three run-through inserting holes; the three connecting holes and the three inserting holes may be distributed alternately and evenly at intervals along an outer circumference of the bearing; one single-phase terminal may pass through one connecting hole; and the potting glue covers the three connecting holes and the three inserting holes.

Further, a first end wall of the partition wall facing the motor mounting chamber may be provided with second collision avoidance grooves; each of the second collision avoidance groove extends from the respective connecting holes to the stator; terminals of the stator may be located in the second collision avoidance grooves, and may be connected with the first terminal portions, such that the potting glue covers the terminals of the stator.

Further, the stator may include a winding; and the potting glue covers an end portion of the winding closer to the partition wall.

Further, the drive assembly may include a three-phase terminal block; the three-phase terminal block may include a terminal block body and three single-phase terminals; the terminal block body is cylindrical; the three single-phase terminals may be each arranged along an axial direction of the terminal block body, and may be arranged at an outer circumference of the terminal block body; the single-phase terminals each may be provided with a first terminal portion and a second terminal portion, which may be respectively located on two ends along an axial direction of the terminal block body; and the first terminal portions may be connected with the stator, and the second terminal portions may be connected with the motor controller.

Further, an outer wall of the housing may be provided with a liquid cooling channel; and the partition wall may be provided with partition cooling grooves, each of which may communicate with the liquid cooling channel.

In order to achieve the twenty-fourth objective of the present disclosure, the present disclosure provides a vehicle provided with the above drive assembly.

In order to achieve the twenty-fifth objective of the present disclosure, the present disclosure provides a drive assembly. The drive assembly includes a housing, a motor controller, a bearing, a rotor, and a stator, wherein the housing is provided therein with a chamber along an axial direction of the housing; an inner wall of the housing is provided with a partition wall along a radial direction of the housing, the partition wall divides the chamber into a motor mounting chamber and a controller mounting chamber; the bearing is provided on the partition wall; the rotor is provided in the motor mounting chamber, and is connected with the bearing; the stator is provided in the motor mounting chamber, and is located outside the rotor; the motor controller is provided in the controller mounting chamber; the drive assembly further includes three single-phase terminals, which pass through the partition wall and are connected between the motor controller and the stator; an outer wall of the housing is provided with a liquid cooling channel; and the partition wall is provided with a partition cooling groove, which communicates with the liquid cooling channel.

Further, the partition wall is provided with multiple partition cooling grooves which may be distributed in a circumferential direction of the partition wall.

Further, the partition cooling groove may be provided with a guide baffle, which extends inwards.

Further, an outer end of the partition cooling groove may be provided with mounting groove; and the guide baffle may be provided with locking portions, which may be located in the mounting groove.

Further, the guide baffle may be provided with a guide groove close to an outer end of the partition cooling groove.

Further, the guide baffle may be provided with a through hole at a center thereof.

Further, the outer end of the partition cooling groove may have a circumference greater than a circumference of an inner end of the partition cooling groove.

Further, the outer end of the partition cooling groove and an outer end of the liquid cooling channel may be open; and the drive assembly further may include a casing, which covers the outer wall of the housing, and may be located outside the partition cooling groove and the liquid cooling channel.

Further, the liquid cooling channel may include a motor cooling groove and a controller cooling groove; the motor cooling groove may be located on an outer wall of the motor mounting chamber, and the controller cooling groove may be located on an outer wall of the controller mounting chamber; and the partition cooling groove may communicate with the motor cooling groove and the controller cooling groove, and may be located therebetween.

In order to achieve the twenty-sixth objective of the present disclosure, the present disclosure provides a vehicle provided with the above drive assembly.

In order to achieve the twenty-seventh objective of the present disclosure, the present disclosure provides a drive assembly. The drive assembly includes a housing, a motor controller, a cover, a bearing, a rotor, and a stator, wherein the housing is provided therein with a chamber along an axial direction of the housing; an inner wall of the housing is provided with a partition wall along a radial direction of the housing, the partition wall divides the chamber into a motor mounting chamber and a controller mounting chamber; the partition wall is provided with a mounting hole, in which the bearing is provided; the rotor is provided in the motor mounting chamber, and is connected with the bearing; the stator is provided in the motor mounting chamber, and is located outside the rotor; the motor controller is provided in the controller mounting chamber; the drive assembly further includes a resolver; the resolver is provided in the mounting hole, and is located at an end of the bearing closer to the controller mounting chamber; and the resolver is connected with a rotating shaft of the rotor, and is electrically connected with the motor controller.

Further, the drive assembly further may include a chamber cover, which covers the mounting hole and may be connected with the partition wall; and the chamber cover covers the resolver at the controller mounting chamber side.

Further, the chamber cover may be provided with a signal connection terminal, which may be connected with the resolver.

Further, the motor controller may include a main circuit board; and the main circuit board may be provided with a signal connection socket, which may be connected with the signal connection terminal.

Further, the drive assembly further may include a three-phase terminal block; the three-phase terminal block may be connected with the partition wall, and may be located on one end of the mounting hole closer to the controller mounting chamber; the three-phase terminal block may include a terminal block body and three single-phase terminals; the terminal block body is cylindrical; the three single-phase terminals each may be arranged along an axial direction of the terminal block body, and may be arranged at an outer circumference of the terminal block body; the three-phase terminal block may be provided on one end of the mounting hole in the motor mounting chamber; and the three single-phase terminals may pass through the partition wall and may be connected between the motor controller and the stator.

Further, the partition wall may be provided with a mounting ring wall extending toward the motor mounting chamber at an outer circumference of the mounting hole; the bearing may be provided inside the mounting ring wall; the single-phase terminals each may be provided with a first terminal portion and a second terminal portion, which may be respectively located on two ends along an axial direction of the terminal block body; and the first terminal portions of the three single-phase terminals may be located at an outer circumference of the mounting ring wall.

Further, the terminal block body may be provided therein with a wiring groove; on a projection plane of the terminal block body perpendicular to the axial direction, projection planes of the first terminal portions perpendicular to the axial direction may be located at an outer circumference of a projection plane of the wiring groove perpendicular to the axial direction, and projection planes of the second terminal portions perpendicular to the axial direction may be located inside the projection plane of the wiring groove perpendicular to the axial direction; and the resolver is located in the wiring groove.

Further, a magnetic ring may be further provided at the outer circumference of the terminal block body, and may be located outside of the resolver.

Further, an outer wall of the housing may be provided with a liquid cooling channel; and the partition wall may be provided with partition cooling grooves, each of which may communicate with the liquid cooling channel.

Further, an end surface of the partition wall facing the motor mounting chamber may be filled with potting glue.

In order to achieve the twenty-eighth objective of the present disclosure, the present disclosure provides a vehicle provided with the above drive assembly.

Solutions to the Problem

Beneficial Effects of the Present Disclosure

Beneficial Effects

The cylindrical housing enables full use of the space at the rear end in an axial direction of the motor, such that the rotor is rotatably provided in the motor mounting chamber, and the motor controller is provided in the controller mounting chamber. This design effectively reduces the occupied space, improves the space utilization, and realizes the high integration of the drive assembly. The multiple power transistors are circumferentially arranged and connected with the inner wall of the controller mounting chamber. The waste heat of the power transistors can be efficiently conducted to the interconnected controller cooling groove and motor cooling groove, realizing integrated liquid cooling and improving heat dissipation efficiency. Besides, using the inner circumferential wall as a heat conductor can effectively optimize the device layout of the motor controller, avoid the need for an additional heat conduction structure, and facilitate the highly integrated design of the device.

The even distribution facilitates space utilization. The power transistors are turned on by time sharing in actual operation. Therefore, the distributed arrangement realizes time-sharing heat conduction at different positions, thereby further improving the heat conduction efficiency.

The heat-conducting surfaces are closely adjacent to the packages of the power transistors, which increases the heat conduction area and improves the heat conduction efficiency. The collision avoidance grooves are convenient for the processing of the heat-conducting surfaces, and a certain collision avoidance space is formed between two power transistors.

The heat-conducting sheets may be made of thermally conductive silicone or a thermally conductive ceramic plate, which improves the heat conduction efficiency between the packages of the power transistors and the heat-conducting surfaces.

The power transistor mounting groove positions and limits the power transistors.

The holding member is provided in the power transistor mounting groove, and exerts an elastic force on the power transistors toward the inner wall of the controller mounting chamber, so that the power transistors are closely attached to the inner wall of the controller mounting chamber, thereby ensuring stable heat conduction.

The positioning frame is provided in the power transistor mounting groove, which limits the power transistors, so as to effectively improve the mounting stability of the power transistors. This design improves the performance stability of the drive assembly that is used in a severe vibration environment.

It can be seen from the above that, by utilizing the space at the rear end in the axial direction of the motor, through the arrangement of the partition wall and the bearing, the rotor is rotatably provided in the motor mounting chamber, and the motor controller is provided in the controller mounting chamber. Three single-phase terminals pass through the partition wall and are connected between the motor controller and the stator. The projection planes of the three single-phase terminals perpendicular to the axial direction are located between the projection plane of the bearing perpendicular to the axial direction and the projection plane of the stator perpendicular to the axial direction. When the terminals of the stator and the single-phase terminals are connected, that is, when the rotor is not mounted, an operating space is reserved between the bearing and the stator. This facilitates the connection of the terminals of the stator and the single-phase terminals. The motor controller is provided at the rear end in an axial direction of the motor, which effectively reduces the occupied space, improves the space utilization, and realizes the high integration of the drive assembly.

The bearing is stably provided in the mounting ring wall, which improves the operational stability of the motor, and the three single-phase terminals are located on the outer circumferential wall of the mounting ring wall, which makes it convenient for the mounting and positioning of the terminals of the stator.

The first collision avoidance grooves can position the terminals of the stator, and optimize the layout space, thereby improving the connecting easiness and reliability.

The fixing holes are configured to attach and fix the motor controller. The connecting holes and the fixing holes are located between the bearing and the stator, so that it is easy to disassemble and assemble.

The second collision avoidance grooves can accommodate the wires and terminals of the stator, thereby optimizing the layout space.

The chamber cover isolates the two chambers, thereby improving the operational stability.

The fixing holes located on the second end wall of the partition wall can be used to mount and position the terminal block, such that different devices can be disassembled and assembled from both sides of the partition wall.

In addition, considering that the stator has a three-phase winding, the three single-phase terminals are arranged at the outer circumference of the terminal block body to connect the terminals of the stator correspondingly, thereby optimizing the wiring layout. In addition, the space formed by the three single-phase terminals can accommodate components such as the bearing, thereby improving the compactness of the structure layout.

The multiple power transistors are circumferentially arranged and connected with the inner wall of the controller mounting chamber. The waste heat of the power transistors can be efficiently conducted to the interconnected controller cooling groove and motor cooling groove, realizing integrated liquid cooling and improving heat dissipation efficiency. Besides, using the inner circumferential wall as a heat conductor can effectively optimize the device layout of the motor controller, avoid the need for a heat conduction structure, and facilitate the highly integrated design of the device.

The main circuit board, the positive electrode connection plate, and the negative electrode connection plate are each configured in a circle, and the three single-phase connection plates are each configured in a fan or arcuate shape. The three single-phase connection plates are coplanar and form a circle-like outline. The positive electrode connection plate, the negative electrode connection plate and the three single-phase connection plates are laminated, and are electrically connected with the main circuit board through pins at their respective outer edges, so as to realize the corresponding circuit connection. The laminated structure reduces the axial dimension and achieves a compact purpose, and the laminated structure is simple and is easy for assembly, improving assembly efficiency.

The arrangement of the pins in the same circumferential direction optimizes the wiring layout and a circuit layout of the main circuit board.

The collision avoidance grooves make it easy for the pins to be arranged in the same circumferential direction, and can achieve the corresponding limiting purpose.

One single-phase bridge arm pin group, one positive electrode pin, and one negative electrode pin constitute one single-phase bridge arm. The multiple bridge arms are arranged in an orderly manner in the circumferential direction of the main circuit board, and the power transistors operate in a time-sharing manner during inverter driving, so the power transistors can also be distributed at intervals by using UVW in the circumferential direction. Therefore, the distributed arrangement realizes time-sharing heat conduction at different positions, thereby further improving the heat conduction efficiency.

The collision avoidance holes are centrally provided, and the arcuate single-phase connection plates in a circle form a connecting space at a center. Thus, the projection planes of the positive electrode connection terminals, the negative electrode connection terminals, and the three single-phase connection terminals, which are perpendicular to the axial direction, are located inside the projection plane of the second collision avoidance hole perpendicular to the axial direction. The positive electrode connection terminals, negative electrode connection terminals and single-phase connection terminals are centrally arranged, which is convenient for connection, and the pins are arranged circumferentially, which effectively optimizes the circuit wiring layout.

The connection terminals are arranged centrally, the pins are arranged circumferentially, and the power transistors are located at the outer circumference of the main circuit board. Thus, the pins of the power transistors are located at the circumference of the positive electrode and negative electrode pins and the single-phase pins, such that the main circuit board has more central space for the driving circuit layout, thereby effectively optimizing the circuit wiring layout.

The positive electrode connection plate is a bottomed cylinder, which accommodates the multiple capacitors and realizes effective positioning of the capacitors. In addition, the negative electrode connection plate plays the role of covering and positioning, which provides desired support for the stable connection of the capacitors. The main circuit board, the negative electrode connection plate, the multiple capacitors and the positive electrode connection plate are laminated in sequence. The laminated structure reduces the axial dimension and achieves the compact purpose, and the laminated structure is simple and is easy for assembly, improving assembly efficiency.

The first collision avoidance hole is used for mounting, positioning and placement of terminals. The annular device accommodating space is used to hold the multiple capacitors, such that the multiple capacitors are distributed circumferentially and well supported and positioned. The axially arranged electrical contacts are respectively electrically connected with the two ends of the capacitor to ensure the electrical connection stability.

The negative electrode connection plate is stably provided on the supporting platform, and the positive electrode connection terminals and the negative electrode connection terminals are located in the second collision avoidance hole. This design realizes the centralized arrangement of terminals, optimizes the layout, and improves the connection efficiency. The mounting shell and the positioning post assembly provide stable support and fixation for the main circuit board, the positive electrode connection plate, the negative electrode connection plate, and even the motor controller.

The third collision avoidance hole of the mounting shell is used for assembly and positioning of other equipment. The connection and fixing platforms provide stable support for the connection of the positive electrode and negative electrode. The positioning posts provide support and positioning for the main circuit board, the positive electrode connection plate and the negative electrode connection plate. A capacitor positioning space is formed by the four positioning posts, which provides stable support for the connection of the capacitors and ensures the stability of the motor controller.

The radial arrangement of the first positioning posts and the second positioning posts is adapted to the arrangement direction of the capacitors which are arranged circumferentially, thereby further positioning the capacitors and improving the stability of the capacitors.

In addition, considering that the stator has a three-phase winding, the three single-phase terminals are arranged at the outer circumference of the terminal block body to connect the terminals of the stator correspondingly, thereby optimizing the wiring layout. In addition, the space formed by the three single-phase terminals can accommodate components such as the bearing, thereby improving the compactness of the structure layout.

The first terminal portions and the second terminal portions are respectively located outside or inside the wiring groove. The first terminal portions are circumferentially scattered to avoid the bearing, and the second terminal portions are circumferentially concentrated to achieve centralized connection of the motor controller and improve the circuit layout utilization of the motor controller.

Through secondary injection molding, the central ring portion, the outer connecting portions and the inner connecting portions are wrapped around the single-phase terminals, thereby improving the protection between the two terminal portions. The central ring portion can also be used for the mounting and positioning of other devices. The outer connecting portions and the first terminal portions are located outside the central ring portion in an axial direction and protrude outwards in a radial direction to avoid the bearing or the resolver and improve the space utilization.

The shielding wall can play a role of positioning and limiting for wiring to improve the connection stability, and also play a role of insulating the terminals of the stator. The three-phase terminal block is fixedly mounted in the drive assembly through the mounting portions, and one mounting portion is located beside one second terminal portions, which is easy for assembly and disassembly. Since the terminal block body can be provided with devices such as the resolver, the magnetic ring is provided around the terminal block body to reduce electromagnetic interference.

To hold the annularly arranged multiple power transistors at the same time through the annular base portion and the circumferentially distributed holding portions, the holding member is placed in a preset position, which realizes simple assembly and quick positioning.

The manufacturing, forming, assembling and positioning of the sheet-like holding member are relatively simple.

The abutting portions protrude outwards and are configured in an arc shape to provide a stable force for holding the power transistors.

Two adjacent holding portions form a device holding group for holding one power transistor. One first slot maintains the same holding force of two holding portions, and one second slot separates two adjacent device holding groups. This design enables the device holding groups to have a large offset space, and with the help of the annular base portion, the device holding groups can well hold the power transistors.

The laminated structure of the circuit boards reduces the axial dimension and achieves the compact purpose, and the laminated structure is simple and is easy for assembly, improving assembly efficiency. The connection position, the control circuit position, the first soldering position, and the second soldering position are sequentially arranged from a center to an outer side of the main circuit board along a radial direction of the main circuit board. The control circuit position, the first soldering position and the second soldering position are respectively configured in a ring shape. The pins of the positive electrode connection plate, the negative electrode connection plate and the three single-phase connection plates on their respective outer edges are electrically connected with the main circuit board, so as to realize the corresponding circuit connection. The connection terminals are centrally arranged, and the central control circuit has a relatively large space. The annular circuit layout improves the structural coordination with the drive assembly.

The arrangement in inner and outer circumferential directions optimizes the wiring layout and the circuit layout of the main circuit board.

The capacitors are axially connected between the negative electrode connection plate and the positive electrode connection plate. Since the control circuit position does not need to be wired, the projection plane of the capacitors perpendicular to the axial direction is located inside the projection plane of the control circuit position perpendicular to the axial direction. The design avoids the pins and terminal portions on both sides in the radial direction, and effectively improves the rationality of the space layout.

The positive electrode connection terminals, the negative electrode connection terminals and the single-phase connection terminals are circumferentially arranged in sequence, and the Hall elements are provided at the single-phase connection terminals, which realizes the efficient space utilization of the collision avoidance holes and improves the connection easiness.

By utilizing the space at the rear end in the axial direction of the motor, through the arrangement of the partition wall and the bearing, the rotor is rotatably provided in the motor mounting chamber, and the motor controller is provided in the controller mounting chamber. This design effectively reduces the occupied space, improves the space utilization, and realizes the high integration of the drive assembly. The positive electrode connecting plate and the negative electrode connecting plate radially pass through the circumferential wall, making full use of the space in the horizontal direction and reducing the space occupied in the vertical direction or the axial direction.

The sheet-like connecting plates are easy for positioning and mounting, and further facilitate the layout of the axial space.

The arrangement of the three positive electrode connection terminals and the three negative electrode connection terminals facilitates the annular circuit layout of the motor controller. Correspondingly, the connecting plates are each provided with three connecting portions in a circumferential direction. The connecting base portions are used for bearing and connection, and provide stable support and fixation for the connecting plate through triangular positioning.

The laminated arrangement improves the compactness of the structural arrangement. In order to solve the interference problem caused by the laminated arrangement, collision avoidance recesses are provided. Through the reasonable structural arrangement, the positive electrode connecting plate and the negative electrode connecting plate are laminated without interfering with each other.

The insulation design of the connecting sleeve improves the protection and safety of the connecting plates. The connecting box provided on the radial outer circumferential wall facilitates the connection of the positive electrode and negative electrode of the battery without opening the motor mounting chamber.

The outlet direction of the positive electrode connecting plate and the negative electrode connecting plate is designed based on the mounting orientation of the drive assembly. In order to shorten the vertical dimension such that the vehicle has more vertical space at the drive assembly, the connecting holes are located between the top portion and the bottom portion of the housing, and the positive electrode connecting plate and the negative electrode connecting plate are inclined to the vertical direction.

The present disclosure utilizes the space at the rear end in the axial direction of the motor. Through the arrangement of the partition wall and the bearing, the rotor is rotatably provided in the motor mounting chamber and the motor controller is provided in the controller mounting chamber. The three single-phase terminals pass through the partition wall and are connected between the motor controller and the stator. The potting glue is filled on the end surface of the partition wall facing the motor mounting chamber, such that the potting glue covers the first terminal portions that are connected with the terminals of the stator. This realizes potting and sealing of the first terminal portions and the terminals of the stator, thereby effectively improving the protection and efficiently conducting the waste heat to the partition wall.

The projection planes of the three single-phase terminals perpendicular to the axial direction are located between the projection plane of the bearing perpendicular to the axial direction and the projection plane of the stator perpendicular to the axial direction. The operating space reserved between the bearing and the stator facilitates the connection of the terminals of the stator and the single-phase terminals. The bearing is stably provided in the mounting ring wall, which improves the operational stability of the motor, and the three single-phase terminals are located on the outer circumferential wall of the mounting ring wall, which makes it convenient for the mounting and positioning of the terminals of the stator. In addition, the potting glue is accurately filled between the mounting ring wall, the partition wall and the inner wall of the housing, such that the waste heat generated by the bearing can also be conducted through the potting glue.

The first collision avoidance groove can position the terminals of the stator, and optimize the layout space, thereby improving the connecting easiness and reliability. The inserting holes are used for the wire of some sensors such as temperature sensors to pass through, and the connecting holes are used for the single-phase terminals to pass through, so as to improve the isolation between the motor mounting chamber and the controller mounting chamber and avoid mutual interference.

The second collision avoidance grooves can accommodate the leads and terminals of the stator, thereby optimizing the layout space. In addition, the terminals and the leads of the stator, and an end of the winding are positioned by the potting glue. The three single-phase terminals are arranged at the outer circumference of the terminal block body to connect the terminals of the stator correspondingly, thereby optimizing the wiring layout. In addition, the space formed by the three single-phase terminals can accommodate components such as the bearing, thereby improving the compactness of the structure layout.

The liquid cooling channel of the housing communicates with the partition cooling grooves of the partition wall. Therefore, the waste heat of the bearing and the resolver can be quickly transferred from the partition wall to the housing, thereby improving the heat conduction efficiency and the operating performance of the drive assembly.

The present disclosure utilizes the space at the rear end in the axial direction of the motor. Through the arrangement of the partition wall and the bearing, the rotor is rotatably provided in the motor mounting chamber and the motor controller is provided in the controller mounting chamber. Three single-phase terminals pass through the partition wall and are connected between the motor controller and the stator. The liquid cooling channel of the housing communicates with the partition cooling grooves of the partition wall. Therefore, the waste heat of the bearing and some other components can be quickly transferred from the partition wall to the housing, thereby improving the heat conduction efficiency and the operating performance of the drive assembly.

Since the partition wall needs to support the bearing and other devices, the partition wall needs a certain structural space. Thus, the partition cooling grooves are distributed circumferentially to improve the heat conduction efficiency of the partition wall without affecting the strength.

The guide baffles are configured to guide the cooling liquid at the outer side from outer ends to inner ends of the partition cooling grooves, and the mounting grooves make it easy for the mounting and positioning of the guide baffles. The guide grooves at outer ends and the through holes in centers are designed to adjust the flow direction of the cooling liquid, so as to realize sufficient heat exchange and improve the thermal conductivity.

Each partition cooling groove is provided with a larger open outer end and a smaller inner end, which enlarges the size of the channel and improves the heat dissipation performance while ensuring the structural strength of the inner end of the partition wall.

The casing realizes the relative airtightness of the partition cooling grooves and the liquid cooling channel, which facilitates the processing of the grooves and the channel, and improves the processing efficiency and the heat dissipation efficiency of the channel.

The motor cooling groove is mainly used to dissipate the waste heat generated by the motor, and the controller cooling groove is mainly used to dissipate the waste heat generated by the motor controller. The partition cooling grooves are located between the motor cooling groove and the controller cooling groove. The liquid cooling scheme of the integrated heat dissipation channel can improve the heat dissipation efficiency and the performance of the drive assembly.

The bearing and the resolver are both provided in the mounting hole, and the bearing supports the rotor to rotate. The resolver is connected with the rotor and can monitor the rotation state of the rotor. The resolver is located at the side closer to the controller mounting chamber, allowing it to be routed to the motor controller. By utilizing the space at the rear end in the axial direction of the motor, through the arrangement of the partition wall and the bearing, the rotor is rotatably provided in the motor mounting chamber, and the motor controller is provided in the controller mounting chamber. This design effectively reduces the occupied space, improves the space utilization, and realizes the high integration of the drive assembly.

The chamber cover isolates the two chambers, thereby improving the operation stability, and the signal connection terminal and the signal connection socket are easy for wiring.

The three-phase terminal block is provided at the mounting hole, making it easy to connect with the motor controller and the stator.

The first terminal portions are provided at the outer circumference of the bearing, which does not affect the mounting and positioning of the rotor, thereby realizing the compact axial space arrangement of the drive assembly.

In the structural arrangement of the terminal block body, the second terminal portions and the resolver are all located in the wiring groove, thereby improving the space utilization and realizing a compact device layout.

Since the terminal block body is provided therein with the resolver, the magnetic ring is provided around the terminal block body to reduce electromagnetic interference.

The liquid cooling channel of the housing communicates with the partition cooling grooves of the partition wall. Therefore, the waste heat of the bearing and the resolver can be quickly transferred from the partition wall to the housing, thereby improving the heat conduction efficiency and the operating performance of the drive assembly. The potting glue improves the protection and heat conduction efficiency.

BRIEF DESCRIPTION OF THE DRAWINGS

Description of Drawings

Figure 1:
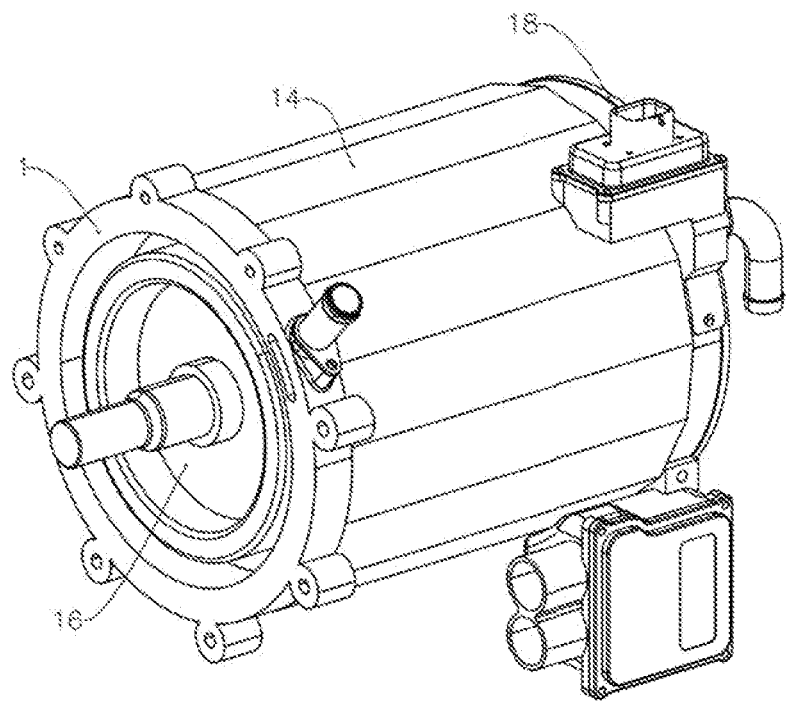
Figure 2:
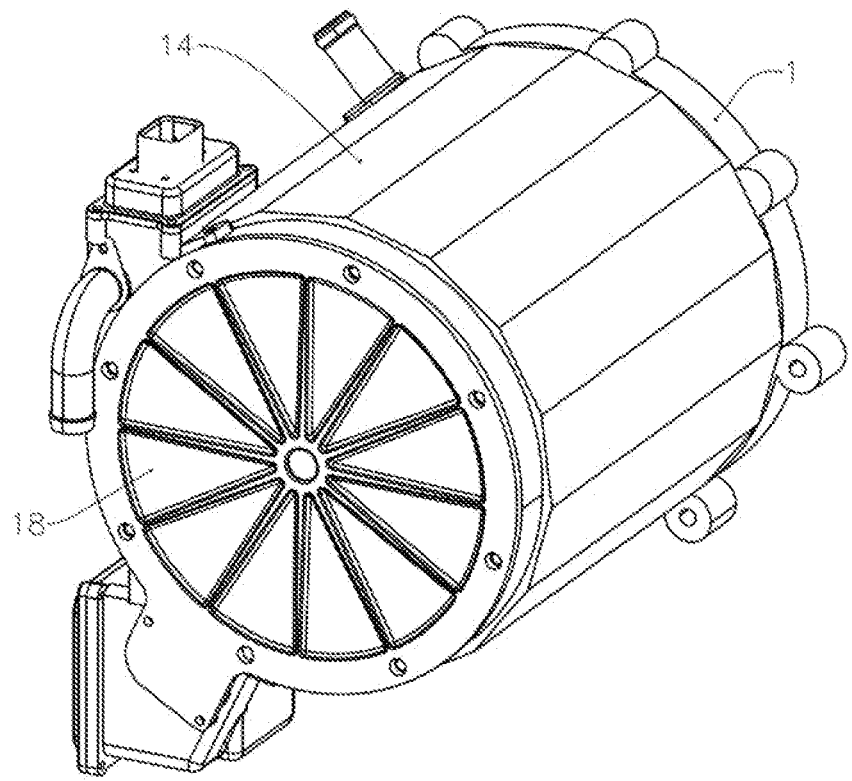
Figure 3:
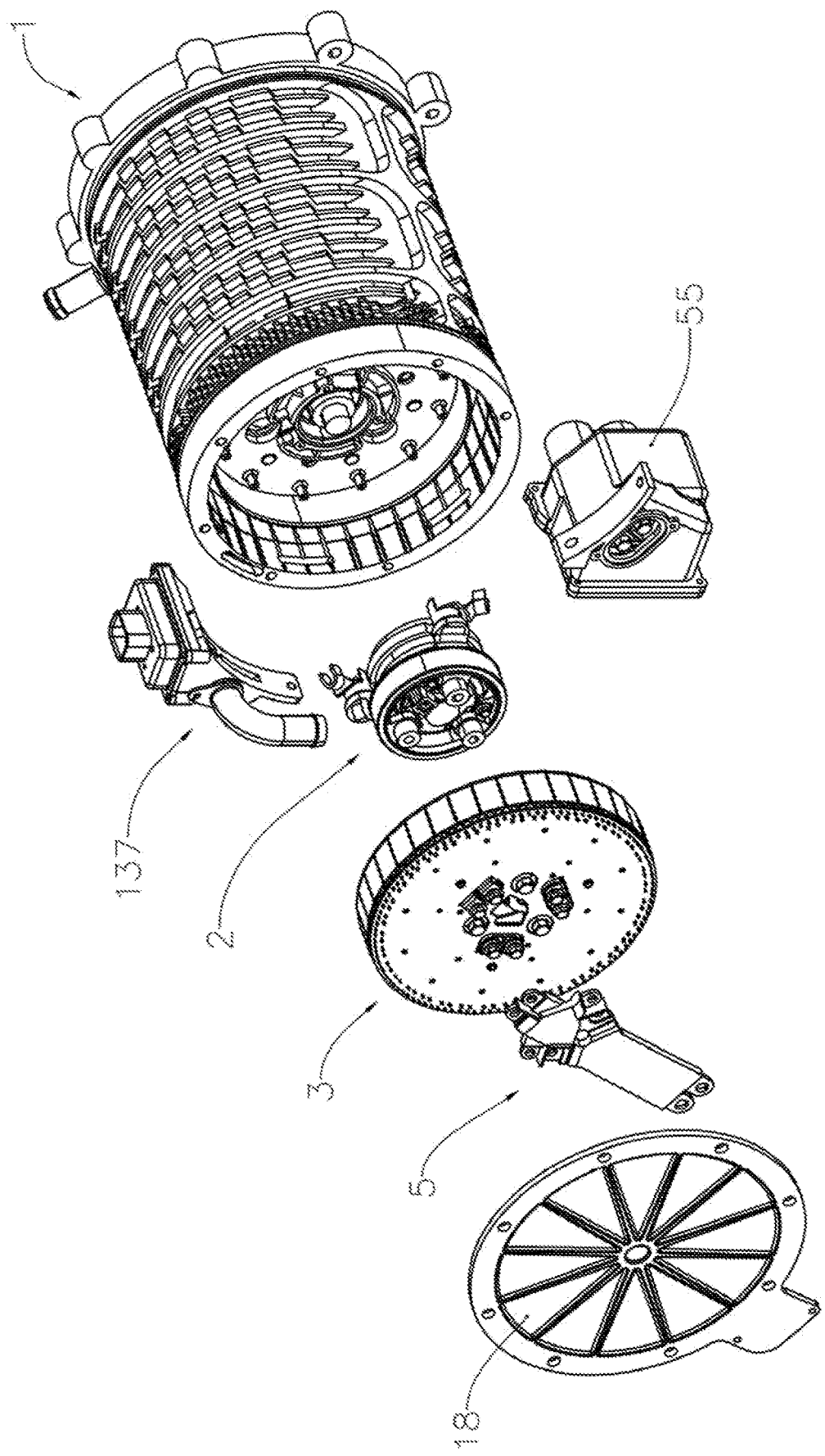
Figure 4:
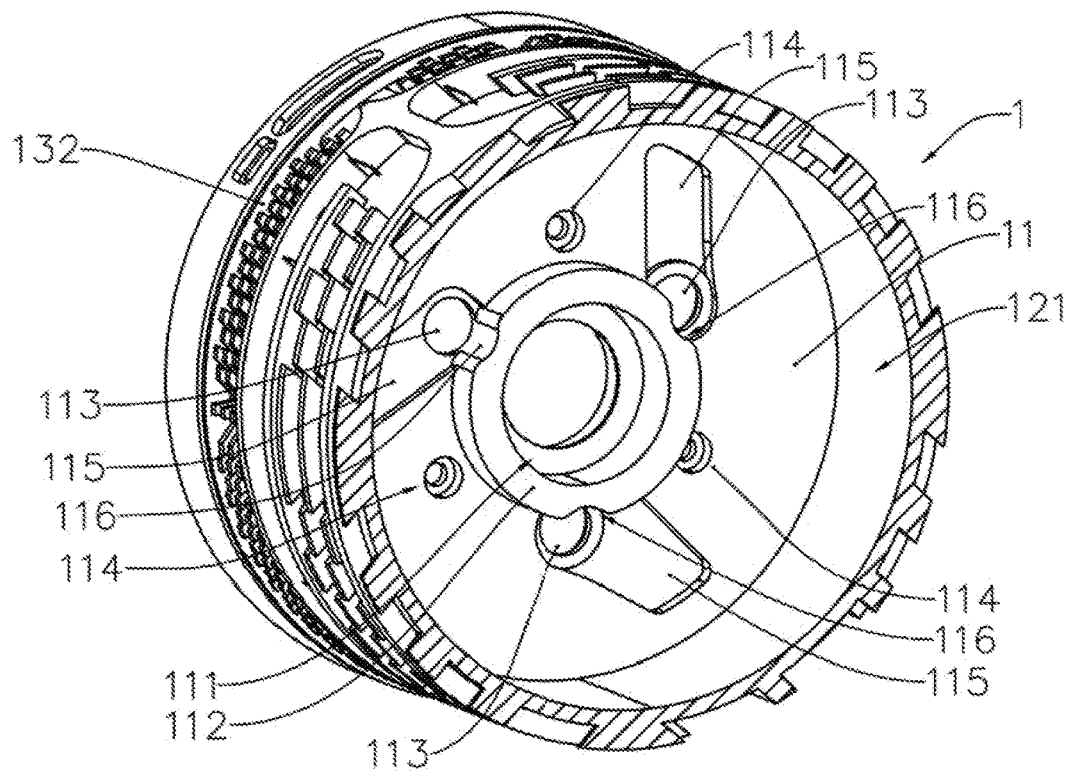
Figure 5:
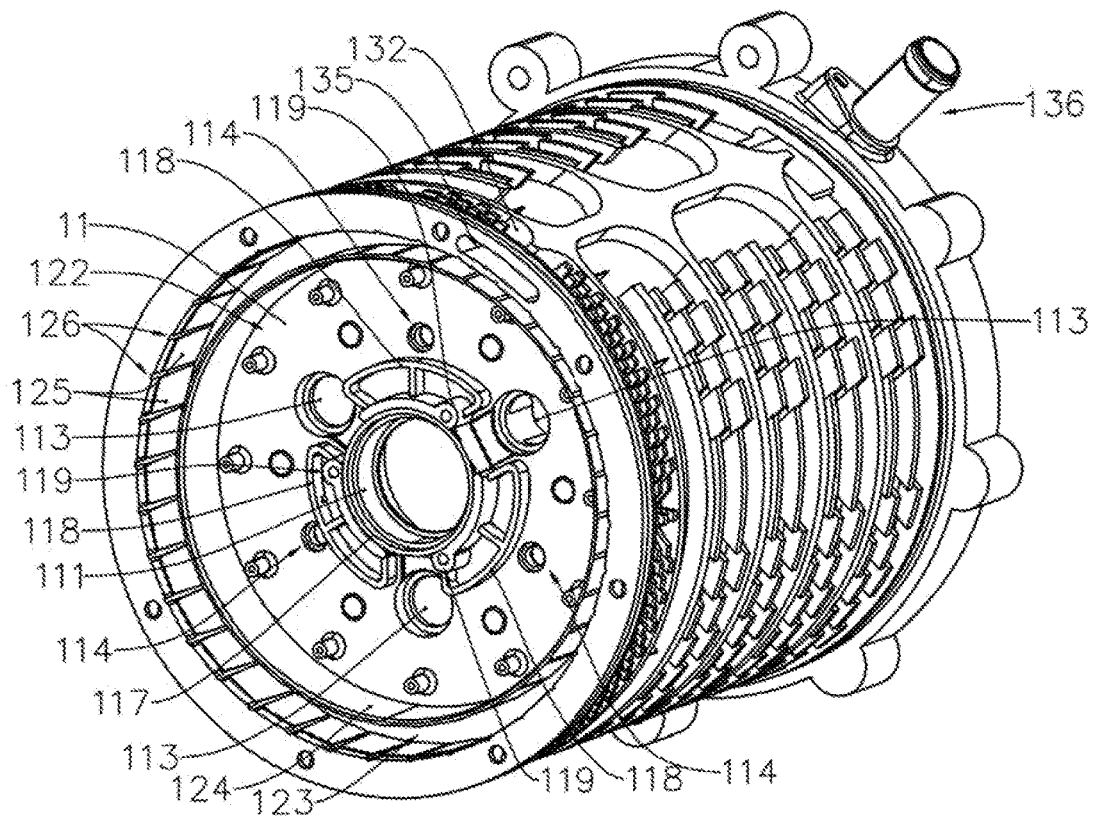
Figure 6:
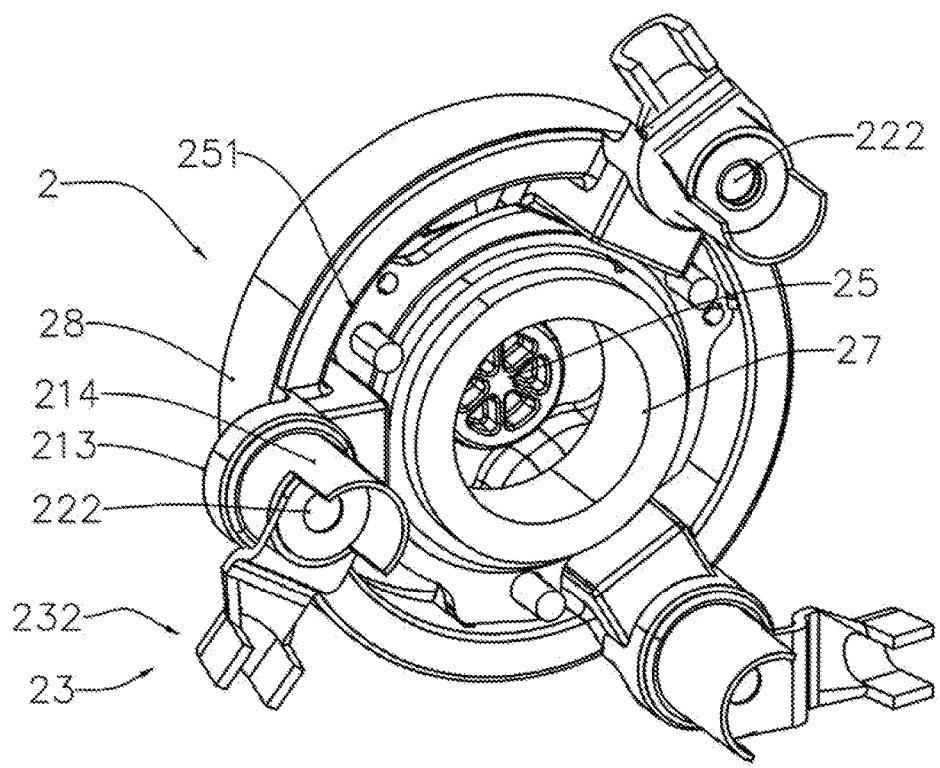
Figure 7:
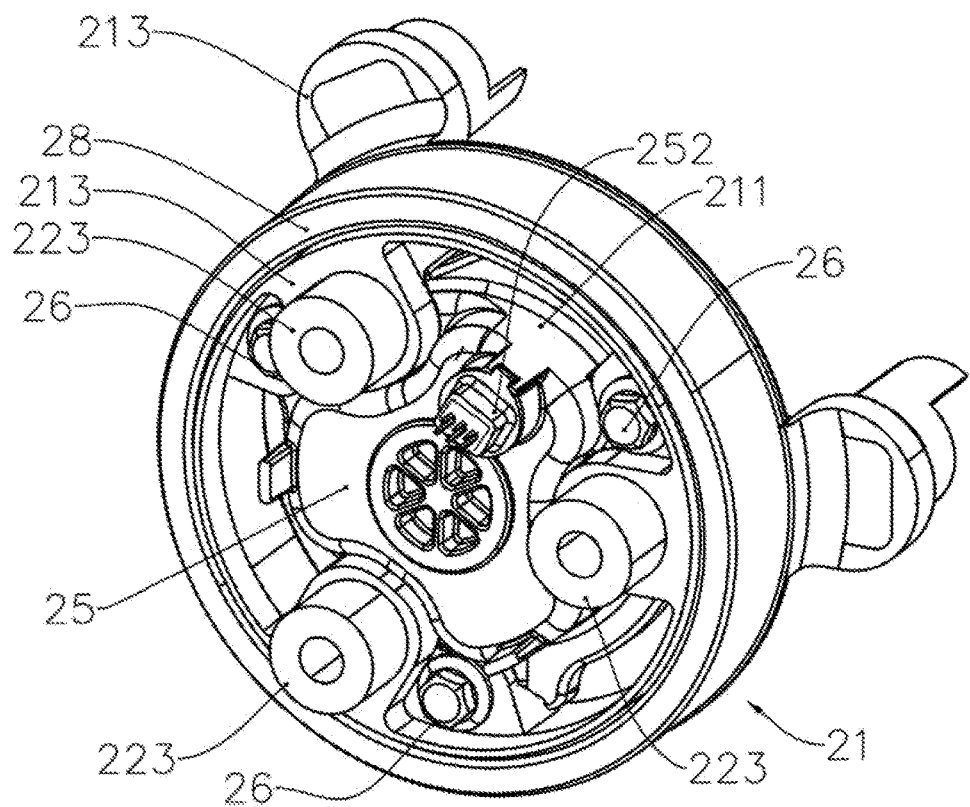
Figure 8:
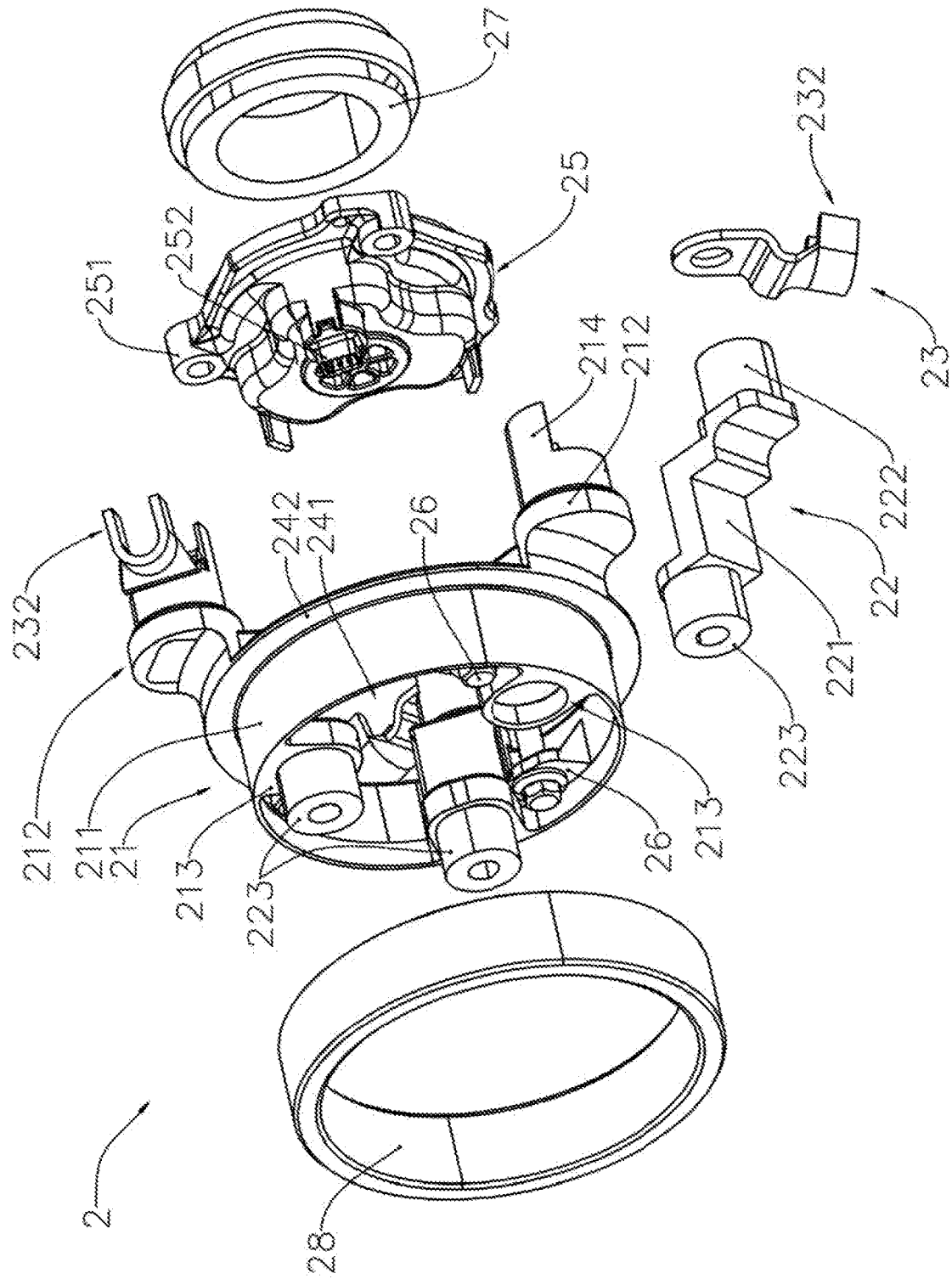
Figure 9:
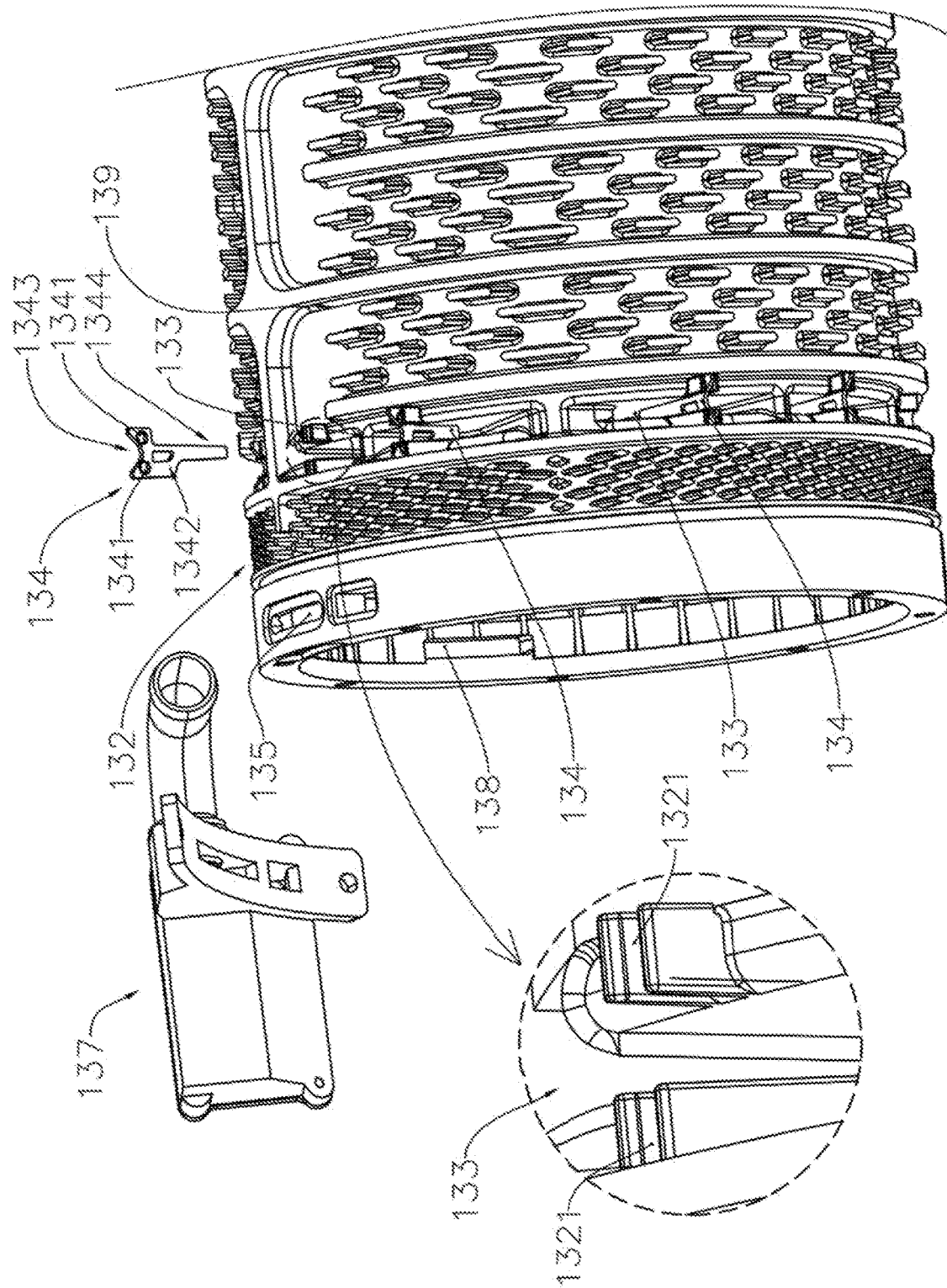
Figure 10:
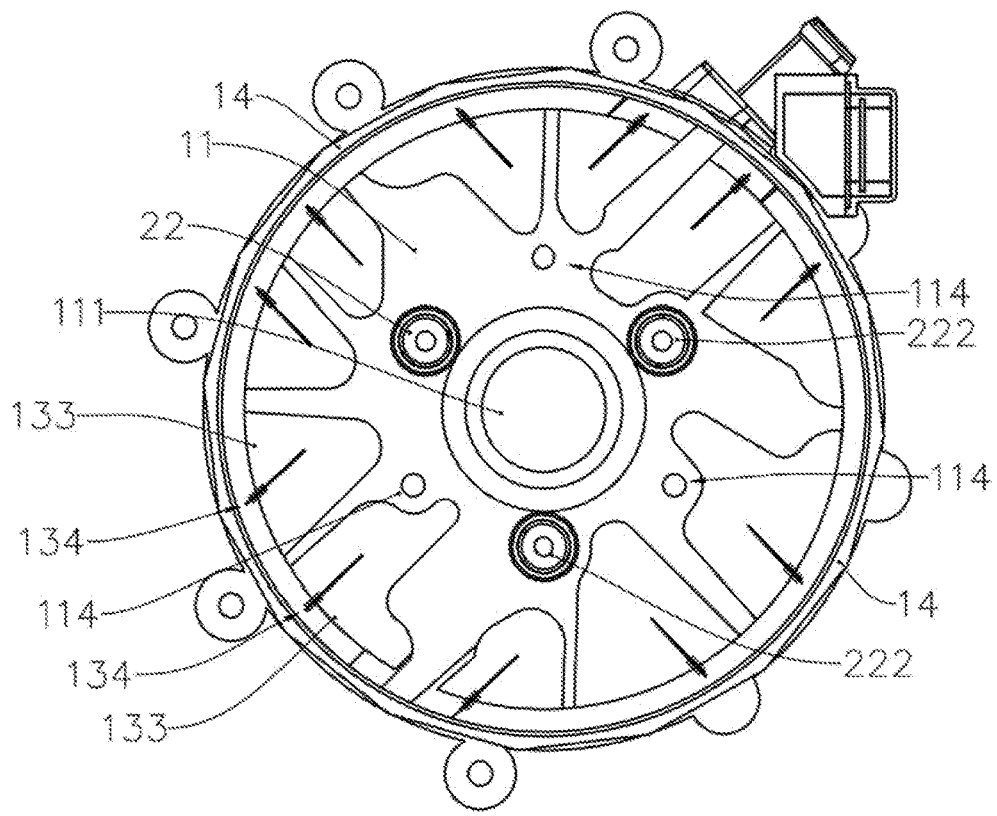
Figure 11:
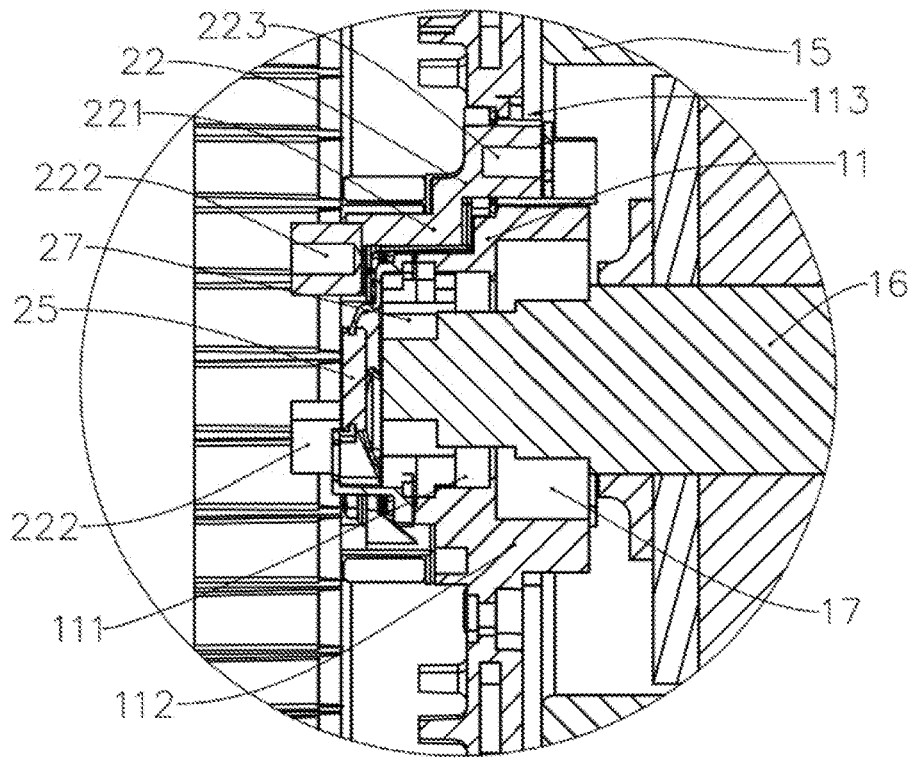
Figure 12:
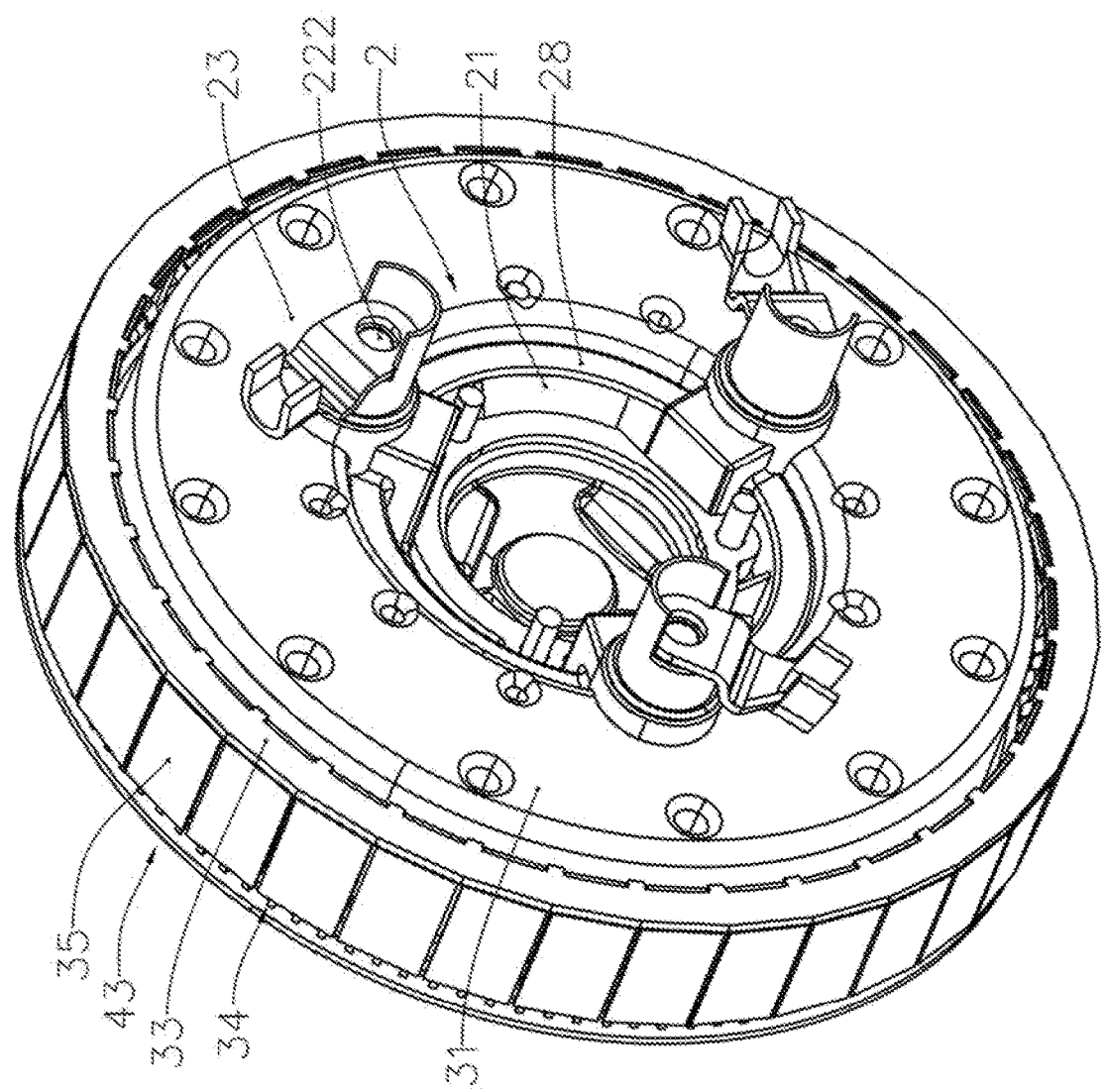
Figure 13:
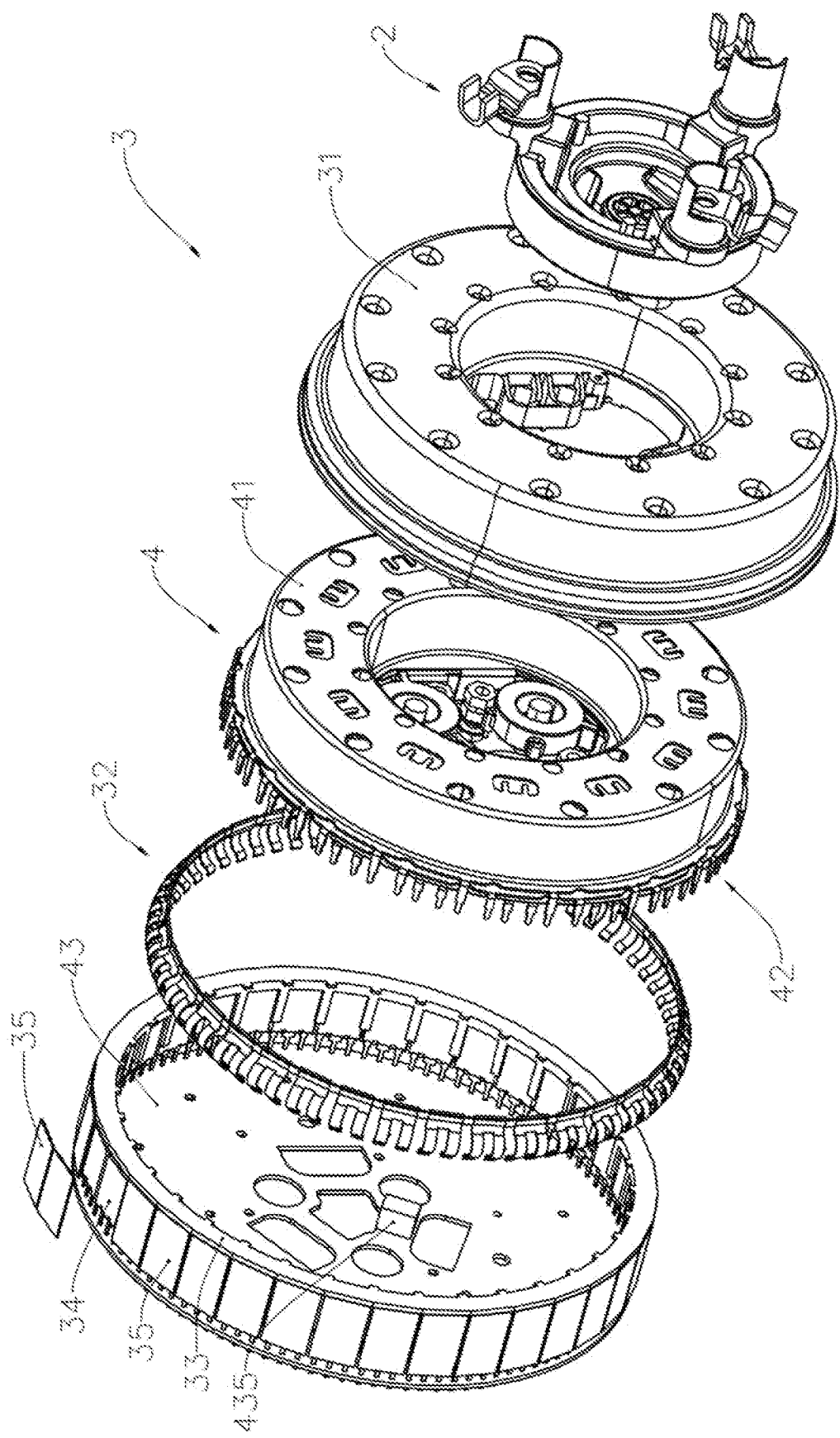
Figure 14:
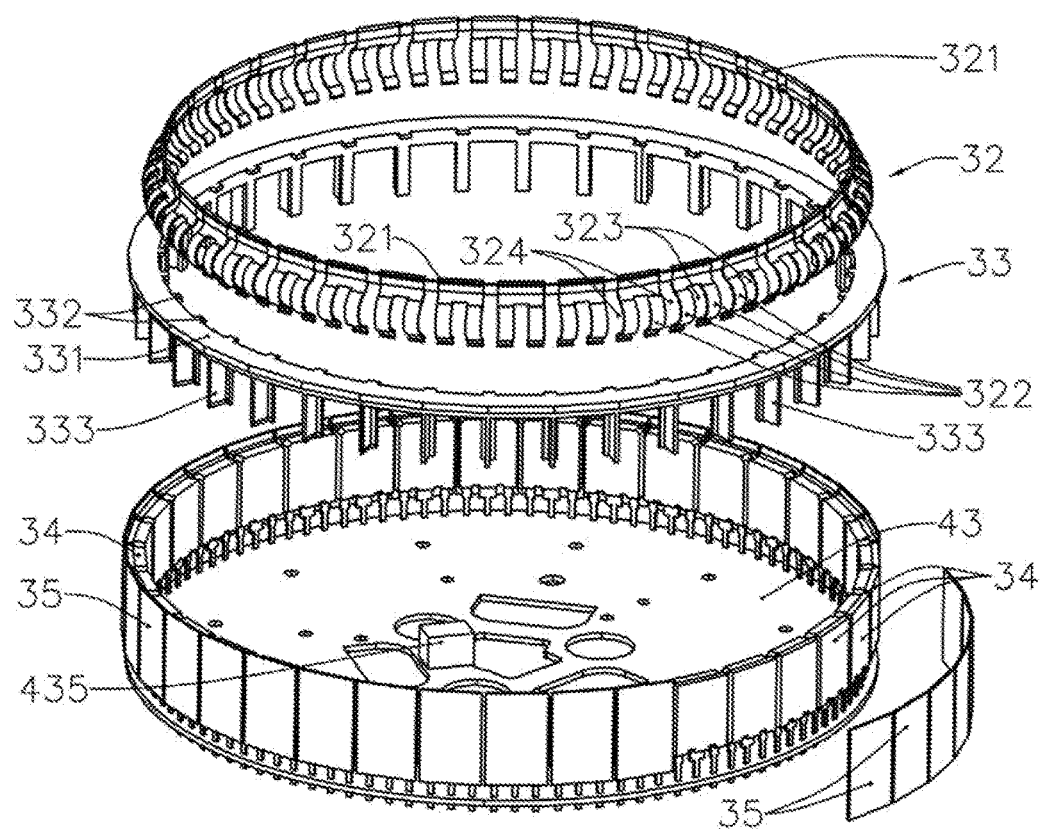
Figure 15:
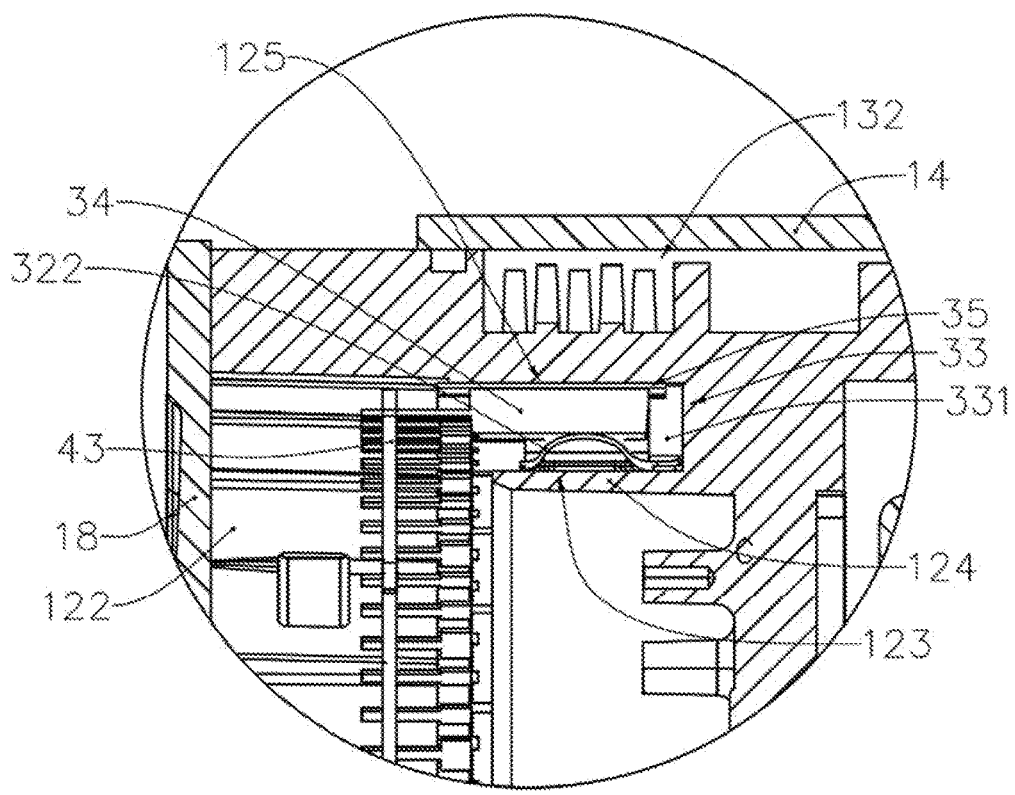
Figure 16:
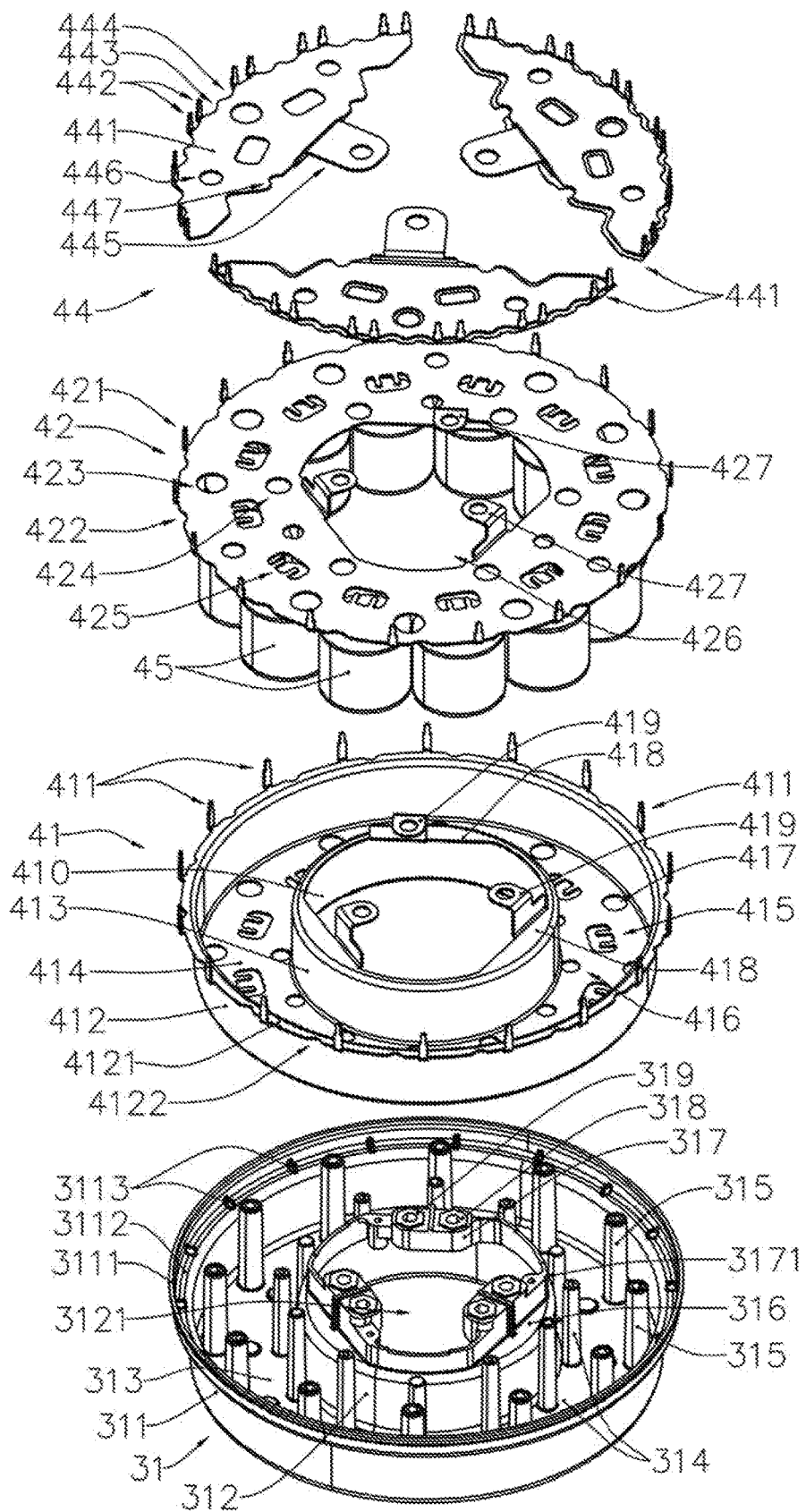
Figure 17:
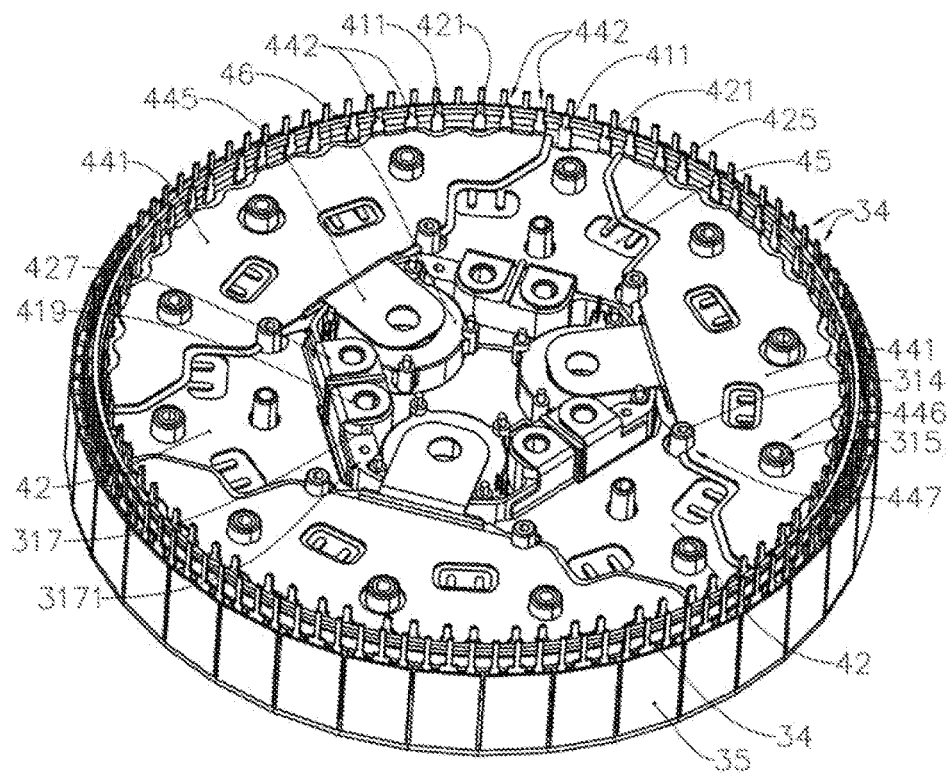
Figure 18:
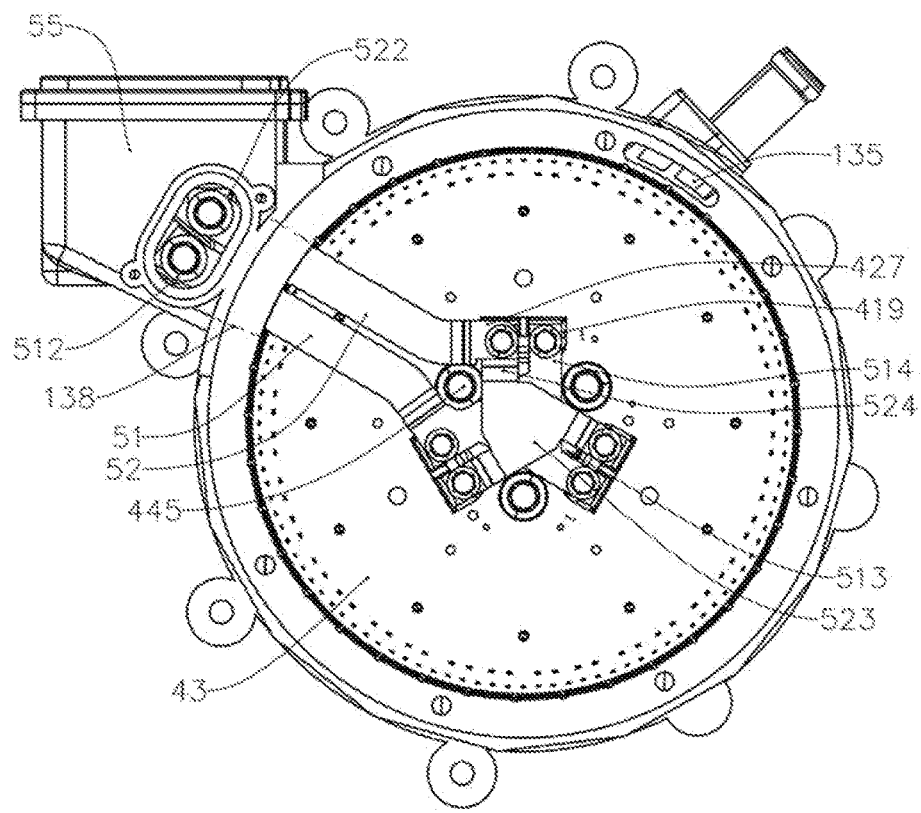
Figure 19:
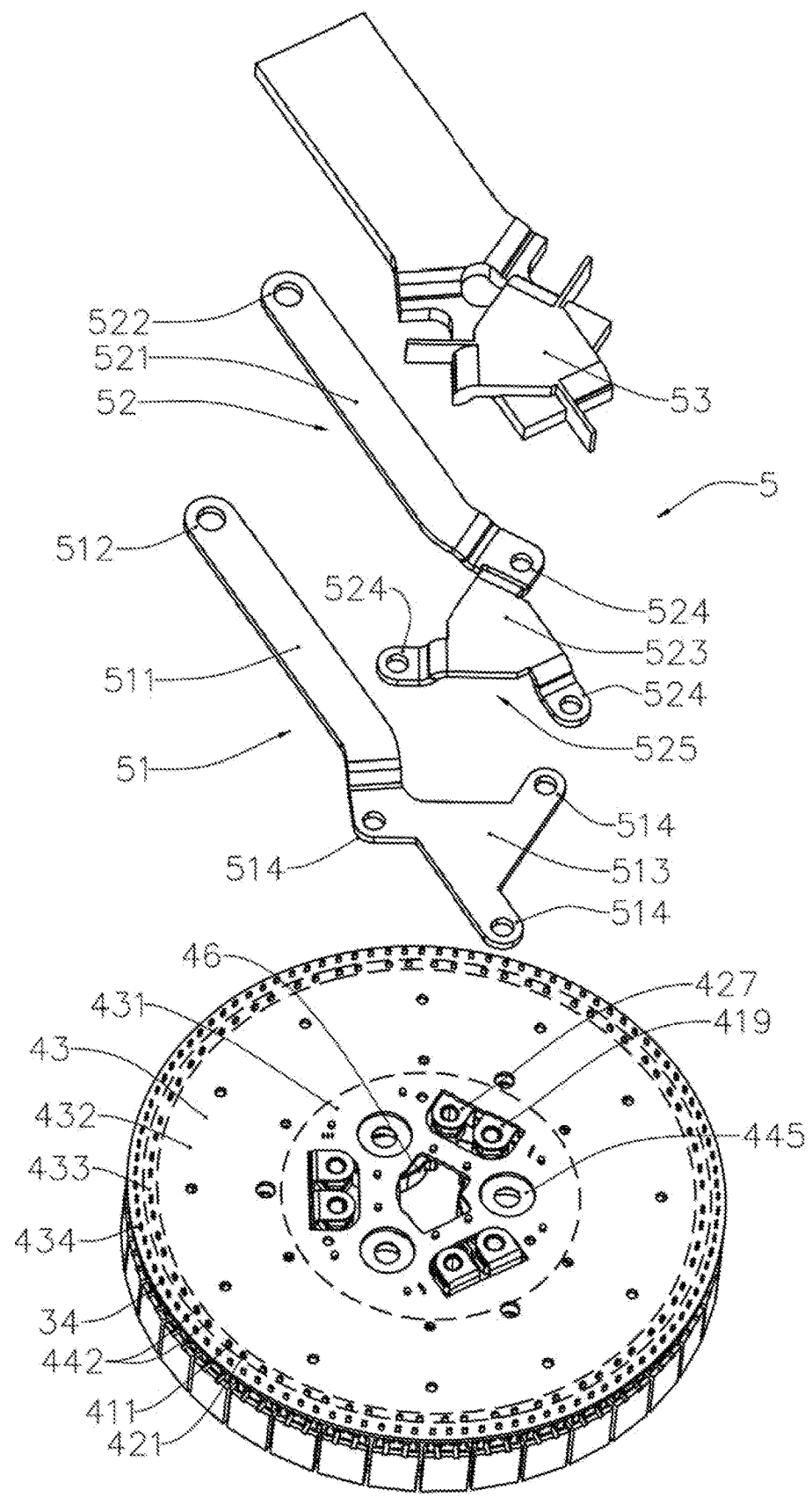
Figure 20:
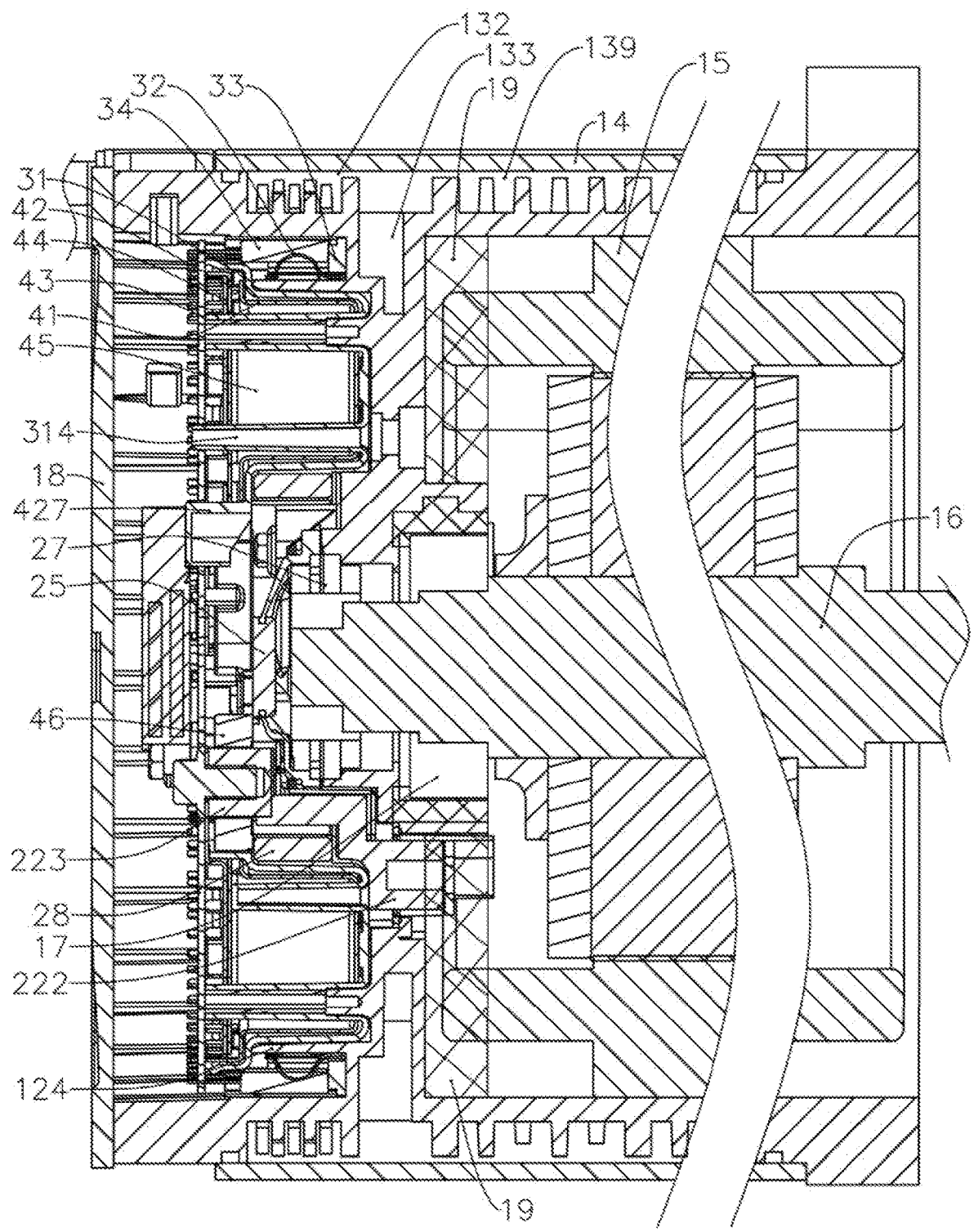

FIG. 1 is a structural view of a drive assembly according to an embodiment of a drive assembly of the present disclosure;

FIG. 2 is a structural view of the drive assembly viewed from another perspective according to the embodiment of the drive assembly of the present disclosure;

FIG. 3 is an exploded view of the drive assembly according to the embodiment of the drive assembly of the present disclosure;

FIG. 4 is a structural view of a housing of the drive assembly showing a motor mounting chamber according to an embodiment of the drive assembly of the present disclosure;

FIG. 5 is a structural view of a housing of the drive assembly showing a controller mounting chamber according to the embodiment of the drive assembly of the present disclosure;

FIG. 6 is a structural view of a three-phase terminal block according to the embodiment of the drive assembly of the present disclosure;

FIG. 7 is a structural view of the three-phase terminal block viewed from another perspective according to the embodiment of the drive assembly of the present disclosure;

FIG. 8 is an exploded view of the three-phase terminal block according to the embodiment of the drive assembly of the present disclosure;

FIG. 9 is a structural view of an outer circumferential wall of the housing according to the embodiment of the drive assembly of the present disclosure;

FIG. 10 is a radial sectional view of the drive assembly at the partition wall according to the embodiment of the drive assembly of the present disclosure;

FIG. 11 is an axial sectional view of the drive assembly at the three-phase terminal block according to the embodiment of the drive assembly of the present disclosure;

FIG. 12 is a structural view of the three-phase terminal block and a motor controller according to the embodiment of the drive assembly of the present disclosure;

FIG. 13 is an exploded view of the three-phase terminal block and the motor controller according to the embodiment of the drive assembly of the present disclosure;

FIG. 14 is an exploded view of power transistor related devices according to the embodiment of the drive assembly of the present disclosure;

FIG. 15 is an axial sectional view of the drive assembly at a power transistor according to the embodiment of the drive assembly of the present disclosure;

FIG. 16 is an exploded view of a laminated busbar assembly according to the embodiment of the drive assembly of the present disclosure;

FIG. 17 is a structural view of the motor controller with a main circuit board removed according to the embodiment of the drive assembly of the present disclosure;

FIG. 18 is a structural view of the drive assembly with a cover removed according to the embodiment of the drive assembly of the present disclosure;

FIG. 19 is an exploded view of the motor controller and a connecting assembly according to the embodiment of the drive assembly of the present disclosure; and FIG. 20 is an axial sectional view of the drive assembly according to the embodiment of the drive assembly of the present disclosure.

The present disclosure is described in further detail below with reference to the drawings and embodiments.

DETAILED DESCRIPTION

Implementations of the Present Disclosure

Embodiment of Drive Assembly:

Referring to FIGS. 1 to 3, the drive assembly includes a housing 1, a cover 18, a casing 14, a motor controller 3, a bearing 17, a rotor 16, and a stator 15. Referring to FIGS. 4, 5 and 11, the housing 1 is cylindrical, and the housing 1 is provided therein with a chamber along an axial direction of the housing 1. An inner wall of the housing 1 is provided with a partition wall 11 along a radial direction of the housing, and the partition wall 11 divides the chamber into a motor mounting chamber 121 and a controller mounting chamber 122. The partition wall 11 is provided with a mounting hole 111 at a center thereof along the axial direction of the housing 1, and the partition wall 11 is provided with a mounting ring wall 112 extending toward the motor mounting chamber 121 at an outer circumference of the mounting hole 111. The mounting ring wall 112 and the partition wall 11 form a mounting step within the mounting ring wall 112. The bearing 17 (its structure not specifically shown) is provided inside the mounting ring wall 112. Three connecting holes 113 and three inserting holes 114 penetrate through the partition wall 11. Each connecting hole 113 has a diameter larger than that of each inserting hole 114. The three connecting holes 113 and the three inserting holes 114 are distributed alternately and evenly at intervals outside the bearing 17. The mounting ring wall 112 is provided with a first collision avoidance groove 116 at each connecting hole 113. The first collision avoidance groove 116 is arc-shaped and concaved toward the bearing 17. The partition wall 11 is provided with three second collision avoidance grooves 115 on a first end wall facing the motor mounting chamber 121. Each of the second collision avoidance grooves 115 extends in a direction inclined to a radial direction. The extending directions of two adjacent second collision avoidance grooves 115 form an acute angle (preferably 60°). The respective second collision avoidance grooves 115 extend from the respective connecting holes 113 toward an inner wall of the housing 1 and the stator 15. The respective second collision avoidance grooves 115 have a width that is the same as the diameter of the respective connecting holes 113. The cover 18 covers the controller mounting chamber 122 and is fixedly connected with the housing 1.

In the controller mounting chamber 122 opposite to the motor mounting chamber 121, the partition wall 11 is provided with a positioning ring wall 117 extending toward the controller mounting chamber 122 at the outer circumference of the mounting hole 111. The positioning ring wall 117 is located on a second end wall of the partition wall 11 facing the controller mounting chamber 122. The partition wall 11 is provided with three mounting platforms 118 at an outer side of the positioning ring wall 117. The mounting platforms 118 each have a B-shaped cross-section, and the mounting platforms 118 are each hollow inside. Each mounting platform 118 is located between two adjacent connecting holes 113. A fixing hole 119 is provided on an edge of a mounting platform 118 closer to the positioning ring wall 117, and three fixing holes 119 are evenly distributed along a circumferential direction of the positioning ring wall 117.

Referring to FIGS. 6 to 8 and FIG. 11, a three-phase terminal block 2 includes a terminal block body 21 and three single-phase terminals 22. The terminal block body 21 extends substantially in a cylindrical shape, and the terminal block body 21 is made of an insulating material such as plastic by injection molding. The terminal block body 21 includes a central ring portion 211, three outer connecting portions 212 and three inner connecting portions 213. The central ring portion 211 is annular and encircles a wiring groove 241. An outer circumference of the central ring portion 211 is provided with an annular flange. The central ring portion 211 and the annular flange form an annular mounting step 242. A magnetic ring 28 is provided on the mounting step 242. The inner connecting portions 213 each extend in the wiring groove 241 from the central ring portion 211. The three inner connecting portions 213 are evenly arranged along a circumference of the central ring portion. The outer connecting portions 212 each extend away from the wiring groove 241 from the central ring portion 211. The three outer connecting portions 212 protrude axially and radially outwards, and the three outer connecting portions 212 are evenly arranged along the circumference of the central ring portion. One outer connecting portion 212 and one inner connecting portion 213 are arranged along a same radial section.

The single-phase terminals 22 each extend axially, and each of the single-phase terminals 22 includes a connecting portion 221, a first terminal portion 222 and a second terminal portion 223. The connecting portion 221 is connected between the first terminal portion 222 and the second terminal portion 223. The connecting portion 221 is bent toward the wiring groove 241 in a direction from the first terminal portion 222 to the second terminal portion 223. The first terminal portion 222 and the second terminal portion 223 each are cylindrical and provided with a connection hole. The single-phase terminals 22 passes through the central ring portion 211. The first terminal portions 222 are located at the outer connecting portions 212, and the second terminal portions 223 are located at the inner connecting portions 213. The three single-phase terminals 22 are respectively connected with the central ring portion 211, the three outer connecting portions 212 and the three inner connecting portions 213 through a secondary injection molding process. The central ring portion 211, the outer connecting portions 212 and the inner connecting portions 213 surround the single-phase terminals 22 to achieve the purpose of insulation. The first terminal portion 222 and the second terminal portion 223 are respectively located on two ends along an axial direction of the terminal block body 21. On a projection plane of the terminal block body 21 perpendicular to an axial direction of the terminal block body 21, projection planes of the three first terminal portions 222 perpendicular to the axial direction are located at an outer circumference of a projection plane of the wiring groove 241 perpendicular to the axial direction, and the three second terminal portions 223 are located inside the wiring groove 241. Each of the outer connecting portions 212 is provided with a shielding wall 214 at an outer circumference of the respective first terminal portions 222, and the shielding wall 214 extends in an arc shape.

One first terminal portions 222 is further provided with a terminal clip 23. The terminal clip 23 is provided with a U-shaped clip portion 232 and a connection hole that is configured to connect and fit with the first terminal portion 222. Three mounting portions 26 are further provided in the wiring groove 241. The three mounting portions 26 are circumferentially evenly distributed, and are respectively located beside the second terminal portions 223.

Referring to FIGS. 9 and 10, an outer wall of the housing 1 is provided with a liquid cooling channel. The liquid cooling channel includes a motor cooling groove 139 and a controller cooling groove 132. The motor cooling groove 139 is located on an outer wall of the motor mounting chamber 121, and the controller cooling groove 132 is located on an outer wall of the controller mounting chamber 122. The motor cooling groove 139 and the controller cooling groove 132 are respectively provided therein with heat-conducting posts to increase the heat conduction area. Multiple partition cooling grooves 133 are provided in the partition wall 11. The multiple partition cooling grooves 133 are distributed in a circumferential direction of the partition wall 11. Each partition cooling groove 133 is provided with an opening at an outer end, and is closed inside the partition wall 11. The partition cooling grooves 133 are located between the motor cooling groove 139 and the controller cooling groove 132. Outer ends of the partition cooling grooves 133, an outer end of the motor cooling groove 139 and an outer end of the controller cooling grooves 132 communicate with each other.

The multiple partition cooling grooves 133 each extend toward the bearing 17. Since the first terminal portions 222 and the inserting holes 114 need to be avoided, the partition cooling grooves 133 have different depths. The outer ends of the partition cooling grooves 133 and an outer end of the liquid cooling channel are open. The casing 14 covers the outer wall of the housing 1, and the casing 14 is located outside the partition cooling grooves 133 and the liquid cooling channel, so that the outer ends of the partition cooling grooves 133, the outer end of the motor cooling groove 139 and the outer end of the controller cooling groove 132 communicate with each other. The outer end of each partition cooling groove 133 is provided with mounting grooves 1321 on two sides.

A guide baffle 134 is provided in each of the partition cooling grooves 133. The guide baffle 134 is a flat plate which extends inwards. An outer end of the guide baffle 134 is provided with a guide groove 1343. The guide groove 1343 is close to the outer end of the partition cooling groove 133. The guide baffle 134 is provided with locking protrusions, namely locking portions 1341, on two edges of the guide groove 1343. The locking portions 1341 are provided in the mounting grooves and fit with the mounting grooves to achieve position limiting. A certain circulation space is reserved between an inner end portion 1344 of the guide baffle 134 and an inner end portion of the partition cooling groove 133. The guide baffle is provided with a through hole 1342 at a center thereof, and the through hole 1342 is configured to circulate a cooling liquid. When the cooling liquid flows through the outer ends of the partition cooling grooves 133, the through holes 1342 and the guide grooves 1343 of the guide baffles 134 guide the cooling liquid into the inner ends of the partition cooling grooves 133, thereby improving the heat dissipation efficiency.

A channel opening 135 is provided on the outer wall of the housing 1 at the controller mounting chamber 122. The channel opening 135 is connected with a connection module 137. The connection module 137 is configured to connect a liquid cooling circulation system. A connection port 136 is provided on the outer wall of the housing 1 at the motor mounting chamber 121, and both the connection port 136 and the channel opening 135 communicate with the liquid cooling channel.

Referring to FIGS. 11 and 20, the drive assembly further includes a chamber cover 25 and a resolver 27. The resolver 27 is provided in the mounting hole 111, and the resolver 27 is located at one end of the bearing 17 closer to the controller mounting chamber 122. A rotating shaft of the rotor 16 is connected with the resolver 27, and the resolver 27 is electrically connected with the motor controller 3. The chamber cover 25 covers the mounting hole 111 and is connected with the partition wall 11. The chamber cover 25 is provided with a removable baffle at a center thereof. The chamber cover 25 covers the resolver 27 at a side of the controller mounting chamber 122. The chamber cover 25 is provided with a connection groove, which is provided therein with a signal connection terminal 252. A connection port of the resolver 27 is connected with the signal connection terminal 252. A main circuit board 43 is provided with a signal connection socket 435 corresponding to the signal connection terminal 252. The signal connection terminal 252 is located between single-phase connection terminals and positive electrode and negative electrode connection terminals. The signal connection terminal 252 can be easily connected with the signal connection socket 435.

When the three-phase terminal block 2 is provided on the partition wall 11, the three first terminal portions 222 pass through the connecting holes 113 respectively. The central ring portion 211 of the three-phase terminal block 2 is sleeved outside the positioning ring wall 117, the chamber cover 25 and the resolver 27. That is, the resolver 27 is located inside the wiring groove 241, and the magnetic ring 28 is located outside the resolver 27.

In this way, the three-phase terminal block 2 is mounted to one end of the mounting hole 111 closer to the controller mounting chamber 122. Screws pass through the mounting portions 26 and the positioning holes 251 of the chamber cover 25 to be connected with the fixing holes 119. The three first terminal portions 222 are relatively scattered along an outer circumference of the bearing 17, and the three second terminal portions 223 are relatively concentrated. The three single-phase terminals 22 are connected between the motor controller 3 and the stator 15. On a projection plane of the bearing 17 perpendicular to the axial direction, the projection plane of the three single-phase terminals 22, the three connecting holes 113, and the three inserting holes 114, which are perpendicular to the axial direction, are located between the projection plane of the bearing 17 perpendicular to the axial direction and a projection plane of the stator 15 perpendicular to the axial direction.

The stator 15 is provided with a winding, which is provided with leads and terminals. The terminals of the stator are located in the second collision avoidance grooves 115 and connected with the first terminal portions 222. Potting glue 19 is filled in a space formed by the mounting ring wall 112, the partition wall and the inner wall of the housing. Thus, the potting glue 19 covers the three first terminal portions 222, the three connecting holes, the three fixing holes, the terminals of the stator, and one end of the winding closer to the partition wall. This design improves protection and waterproofness, and achieves certain waste heat conduction and device fixation.

Referring to FIGS. 12 and 13, the three-phase terminal block 2 is provided in a center of the motor controller 3. The motor controller 3 includes a circuit board assembly, multiple capacitors 45, multiple power transistors 34, a holding member 32, a positioning frame 33 and a mounting shell 31. The circuit board assembly may adopt a conventional laminated copper clad circuit, etc. In this embodiment, the circuit board assembly is a laminated busbar assembly 4. The laminated busbar assembly 4 includes the main circuit board 43, a positive electrode connection plate 41, a negative electrode connection plate 42, and a three-phase connection plate assembly 44. The main circuit board 43 is provided with a copper clad circuit, a circuit element and a pad to form a control circuit.

Referring to FIGS. 14, 15 and 5, the motor controller 3 is provided in the motor mounting chamber 121. An inner wall of the controller mounting chamber 122 is provided with multiple heat-conducting surfaces 125. The multiple heat-conducting surfaces 125 are flat surfaces, and the heat-conducting surfaces 125 are connected along a circumferential direction of the inner wall of the controller mounting chamber 122 in sequence. A collision avoidance slot 126 is provided between two adjacent heat-conducting surfaces 125. The housing 1 is provided with a ring wall 124 in the controller mounting chamber 122. A power transistor mounting groove 123 is formed between the ring wall 124 and the inner wall of the controller mounting chamber 122. The power transistor mounting groove 123 is annular and extends axially.

The positioning frame 33 includes an annular base plate 331 and multiple spacers 333. The annular base plate 331 is a flat plate. A radial inner side of the annular base plate 331 is provided with bumps 332 that are circumferentially evenly distributed. The multiple spacers 333 extend along an axial direction of the positioning frame 33, and are provided on the annular base plate 331. The multiple spacers 333 are distributed along a circumferential direction of the annular base plate 331. One side of the annular base plate 331 is adjacent to the partition wall 11, and the spacers 333 are located on the other side of the annular base plate 331 with respect to the spacer wall 11. The spacers 333 each are provided with a T-shaped radial section. The spacers 333 and the bumps 332 are located on a same radial section of the housing 1.

The annular holding member 32 includes an annular base portion 321 and multiple holding portions 322. The annular base portion 321 is an axially extending sheet-like piece. The holding portions 322 are arc-shaped. The multiple holding portions 322 are distributed on the annular base portion 321 along a circumferential direction of the annular base portion 321. The holding portions 322 each include a fixed portion, an abutting portion, and a free portion. The fixed portion is connected with the annular base portion 321. The abutting portion protrudes from the fixed portion toward an outer side of the annular base portion 321. The free portion is located at an end of the abutting portion away from the fixed portion. The abutting portion is located between the fixed portion and the free portion. The abutting portion is arc-shaped, and protrudes away from the annular base portion 321 toward an outer side of the housing 1. The abutting portion also protrudes toward the inner wall of the housing 1 along the radial direction of the housing 1, so the fixed portion and the free portion are both located at a side of the abutting portion closer to an inner side thereof. Two adjacent holding portions 322 form a device holding group. A first slot 323 is provided between the two adjacent holding portions 322 of the device holding group. The first slot 323 extends along an axial direction of the holding member 32. One device holding group holds one power transistor 34. A second slot 324 is provided between two adjacent device holding groups. The second slot 324 extends along the axial direction of the holding member 32. A length of the second slot 324 along the axial direction of the holding member 32 is greater than a length of the first slot 323 along the axial direction of the holding member 32.

The positioning frame 33, the multiple power transistors 34 and the holding member 32 are arranged in the power transistor mounting groove 123. The annular base plate 331 of the positioning frame 33 is located at a bottom of the power transistor mounting groove 123, and the multiple power transistors 34 are arranged along a circumferential direction of the controller mounting chamber 122. Heat-conducting sheets 35 are located between packages of the power transistors 34 and the heat-conducting surfaces 125. The packages of the power transistors 34 are connected with the heat-conducting sheets 35, and the heat-conducting sheets 35 are connected with the heat-conducting surfaces 125. The heat-conducting sheets 35 may be made of silica gel or a ceramic. Every one spacer 333 is located between two adjacent power transistors 34, and the power transistors 34 are each limited by the spacers 333 on two sides. The holding portions 322 are closer to an inner side of the ring wall 124 relative to the inner wall of the housing 1. The holding portions 322 abut between the ring wall 124 and the power transistors 34, and exert an elastic force toward an outside of the housing 1 on the power transistors 34. The second slots 324 fits with the bumps 332 for position limiting. The main circuit board 43 is circular. Pins of the power transistors 34 pass through an edge of the main circuit board 43 and are soldered with the main circuit board 43.

Referring to FIGS. 16 and 17, the mounting shell 31 is a bottomed cylinder. The mounting shell 31 is provided with an inner ring wall 312 at a center thereof, and the inner ring wall 312 encloses a run-through third collision avoidance hole 3121. The mounting shell 31 is provided with an outer ring wall 311 surrounding the inner ring wall 312, and an annular bottom 313 is provided between the outer ring wall 311 and the inner ring wall 312. The outer ring wall 311, the inner ring wall 312 and the bottom 313 enclose a mounting and accommodating space. The bottom 313 of the mounting shell 31 is provided with a positioning post assembly extending along an axial direction of the motor controller 3. The positioning post assembly includes multiple first positioning posts 314 and multiple second positioning posts 315. The multiple first positioning posts 314 are distributed circumferentially, and the multiple second positioning posts 315 are also circumferentially distributed. The multiple second positioning posts 315 are located outside the multiple first positioning posts 314 away from an axis of the mounting shell 31. Each of the first positioning posts 314 has a diameter smaller than that of each of the second positioning posts 315. The multiple first positioning posts 314 and the multiple second positioning posts 315 pass through the positive electrode connection plate 41, the negative electrode connection plate 42 and the three-phase connection plate assembly 44.

Two adjacent first positioning posts 314 and two adjacent second positioning posts 315 which are respectively adjacent to the two adjacent first positioning posts enclose a capacitor positioning space. A connecting line of one first positioning post 314 and one second positioning post 315 adjacent thereto passes through an axis of the mounting shell 31. The multiple first positioning posts 314 and the multiple second positioning posts 315 are radially arranged. One capacitor 45 is located in the capacitor positioning space formed by the two first positioning posts 314 and the adjacent two second positioning posts 315 which are respectively adjacent to the two adjacent first positioning posts.

The mounting shell 31 is provided with three connection and fixing platforms 317, which are located on a top of the inner ring wall 312 and located in the third collision avoidance hole 3121. The three connection and fixing platforms 317 are evenly arranged along a circumferential direction of the third collision avoidance hole 3121. A receiving step 316 is provided at an outer side of each connection and fixing platform 317 away from the axis of the mounting shell 31, for receiving the positive electrode connection plate 41 and fitting with a supporting platform 418. Each connection and fixing platform 317 is provided with a positive electrode connection position 319 and a negative electrode connection position 318. The positive electrode connection position 319 and the negative electrode connection position 318 are respectively provided with connection nuts, and the two connection nuts are arranged side by side. A fixing hole 3171 is provided beside the positive electrode connection position 319 or beside the negative electrode connection position 318 on each connection and fixing platform 317.

A top of the outer ring wall 311 of the mounting shell 31 is provided with an outer flange 3111 protruding outward in a radial direction of the outer ring wall 311. The outer flange 3111 is annular. A bearing step 3112 is provided between the outer flange 3111 and the outer ring wall 311. The bearing step 3112 is configured to receive the positive electrode connection plate 41, and multiple bumps 3113 are provided on an upper surface of the bearing step 3112.

The positive electrode connection plate 41 is a bottomed cylinder. The positive electrode connection plate 41 is entirely made of a metal. The positive electrode connection plate 41 is provided with a first collision avoidance hole 410 at a center thereof. An inner ring wall 413 is provided at an outer circumference of the first collision avoidance hole 410 of the positive electrode connection plate 41. The positive electrode connection plate 41 is provided with an outer ring wall 412 surrounding the inner ring wall 413. A bottom ring wall 414 is provided between the inner ring wall 413 and the outer ring wall 412 of the positive electrode connection plate 41. The bottom ring wall 414 is connected between the inner ring wall 413 and the outer ring wall 412. The bottom ring wall 414, the outer ring wall 412 and the inner ring wall 413 enclose an annular device accommodating space. The device accommodating space is configured to accommodate the multiple capacitors 45 such that the multiple capacitors 45 are distributed circumferentially, and the positive electrode connection plate 41 is configured in the shape of an annular pot. An outer edge of the outer ring wall 412 of the positive electrode connection plate 41 is provided with a radially extending flange 4121. The flange 4121 is provided along a circumferential direction of the outer ring wall 412. Multiple positive electrode pins 411 are circumferentially arranged on the flange 4121. The positive electrode pins 411 extend along the axial direction of the housing 1. A limiting groove 4122 is provided between two adjacent positive electrode pins 411 on the flange 4121. Multiple limiting grooves 4122 are evenly distributed along the circumferential direction. The bottom ring wall 414 is provided with multiple first electrical contacts 415, and the multiple first electrical contacts 415 are distributed circumferentially. The first electrical contacts are formed by grooving in the bottom ring wall 414. The first electrical contacts 415 are connected with positive electrodes of the capacitors 45. The bottom ring wall 414 is further provided with multiple run-through first positioning holes 416 and multiple run-through second positioning holes 417. The multiple first positioning holes 416 are circumferentially evenly distributed, and the multiple second positioning holes 417 are also circumferentially evenly distributed. The multiple first positioning holes 416 are located at an inner side of the first electrical contacts 415, and the multiple second positioning holes 417 are located outside the first electrical contacts 415. The first positioning posts 314 pass through the first positioning holes 416, and the second positioning posts 315 pass through the second positioning holes 417.

An end portion of the inner ring wall 413 closer to the negative electrode connection plate 42 is provided with supporting platforms 418, and the supporting platforms 418 are configured to receive the negative electrode connection plate 42. An inner edge of the supporting platform 418 of the positive electrode connection plate 41 is provided with positive electrode connection terminals 419. The positive electrode connection terminals 419 are bent. The positive electrode connection terminals 419 extend axially and then radially. The positive electrode connection terminals 419 each are provided with a connection hole that is located in the first collision avoidance hole 410.

The negative electrode connection plate 42 is a circular metal plate. An outer edge of the negative electrode connection plate 42 is provided with multiple negative electrode pins 421 in a circumferential direction of the negative electrode connection plate. The multiple negative electrode pins 421 extend axially. The outer edge of the negative electrode connection plate 42 is further provided with multiple first pin collision avoidance grooves 422. The multiple first pin collision avoidance grooves 422 are circumferentially evenly arranged. One first pin collision avoidance groove 422 is provided between two adjacent negative electrode pins 421, such that the negative electrode pins 421 and the first pin collision avoidance grooves 422 are alternately distributed. The negative electrode connection plate 42 is provided with multiple second electrical contacts 425. The multiple second electrical contacts 425 are circumferentially distributed. The second electrical contacts 425 are formed by grooves in the negative electrode connection plate 42. The second electrical contacts 425 are connected with negative electrodes of the capacitors 45. The negative electrode connection plate 42 is further provided with multiple run-through first positioning holes 424 and multiple run-through second positioning holes 423. The multiple first positioning holes 424 are circumferentially evenly distributed, and the multiple second positioning holes 423 are also circumferentially evenly distributed. The multiple first positioning holes 424 are located at an inner side of the second electrical contacts 425, and the multiple second positioning holes 423 are located outside the second electrical contacts 425. The first positioning posts 314 pass through the first positioning holes 424, and the second positioning posts 315 pass through the second positioning holes 423. The negative electrode connection plate 42 is provided with a second collision avoidance hole 426 at a center thereof. The first collision avoidance hole 410 communicates with the second collision avoidance hole 426. An inner edge of the second collision avoidance hole 426 of the negative electrode connection plate 42 is provided with negative electrode connection terminals 427. The negative electrode connection terminals 427 are bent. The negative electrode connection terminals 427 extend axially and then radially. The negative electrode connection terminals 427 each are provided with a connection hole that is located in the second collision avoidance hole 426.

The three-phase connection plate assembly 44 includes three single-phase connection plates 441. The three single-phase connection plates 441 each are arcuate metal plates, and of course they may also be arranged in a fan shape. An outer edge of each of the single-phase connection plate 441 is provided with multiple single-phase pins 442 in a circumferential direction of the each of the single-phase connection plate. The multiple single-phase pins 442 extend axially. The outer edge of each of the single-phase connection plates 441 is further provided with second pin collision avoidance grooves. The second pin collision avoidance grooves include positive electrode collision avoidance grooves 443 and negative electrode collision avoidance grooves 444. Two single-phase pins 442, one positive electrode collision avoidance groove 443 and one negative electrode collision avoidance groove 444 are circumferentially arranged in sequence. An inner edge of each of the single-phase connection plates 441 is provided with a single-phase connection terminal 445. The single-phase connection terminal 445 is provided with a connection hole. The single-phase connection plates 441 each are provided with two collision avoidance grooves 447 and three positioning holes 446. The two collision avoidance grooves 447 are located at the inner edge of the each of the single-phase connection plates 441, and the three positioning holes 446 are circumferentially distributed on a radial outer side of the collision avoidance grooves 447. The three single-phase connection plates 441 are coplanar, so their outer edges form a circle-like outline, and their inner edges enclose a connection space.

When the laminated busbar assembly 4, the multiple capacitors 45 and the mounting shell 31 are assembled, the positive electrode connection plate 41 is mounted in the mounting shell 31, and the multiple capacitors 45 are mounted to the positive electrode connection plate 41. The negative electrode connection plate 42 is provided on the positive electrode connection plate 41, and then the device accommodating space and the capacitors 45 are covered. The negative electrode connection plate 42 is supported by the bearing step 3112, and the bumps 3113 fit with the limiting grooves 4122 for position limiting. The capacitors 45 are connected between the positive electrode connection plate 41 and the negative electrode connection plate 42. The three single-phase connection plates 441 are placed on the negative electrode connection plate 42. Thus, the first positioning posts 314 pass through the first positioning holes 416, the first positioning holes 424 and the collision avoidance grooves 447 in sequence, and the second positioning posts 315 pass through the second positioning holes 417, the second positioning holes 423 and the positioning holes 446 in sequence. Referring to FIGS. 18 and 19, the main circuit board 43 is mounted on the three single-phase connection plates 441. The main circuit board 43 is provided with connection holes corresponding to the positions of the first positioning posts 314 and the second positioning posts 315. The laminated connection is achieved by screws. That is, the main circuit board 43, the three-phase connection plate assembly 44, the negative electrode connection plate 42, the capacitors 45 and the positive electrode connection plate 41 are sequentially laminated and connected. Three insulating layers are provided between the three-phase connection plate assembly 44 and the negative electrode connection plate 42, and the shapes of the three insulating layers are matched with the single-phase connection plates. An insulating layer may also be provided between the negative electrode connection plate 42 and the positive electrode connection plate 41, and an insulating layer may also be provided between the main circuit board 43 and the three-phase connection plate assembly 44. The positive electrode pins 411 pass through the first pin collision avoidance grooves 422 and the positive electrode collision avoidance grooves 443 and are connected to a pad of the main circuit board 43. The negative electrode pins 421 pass through the negative electrode collision avoidance grooves 444 and are connected to the pad of the main circuit board 43. The single-phase pins 442 pass through the main circuit board 43 and are connected to the pad of the main circuit board 43. The multiple positive electrode pins 411, the multiple negative electrode pins 421 and the multiple single-phase pins 442 are arranged along a same circumferential direction. Of course, a positive electrode collision avoidance groove 443 and a negative electrode collision avoidance groove 444 may also form an integrated second pin collision avoidance groove, such that the positive electrode pins pass through the first pin collision avoidance grooves and the second pin collision avoidance grooves, and the negative electrode pins pass through the second pin collision avoidance grooves. Of course, the lamination positions of the three-phase connection plate assembly, the negative electrode connection plate and the positive electrode connection plate are adjustable. For example, the pot-shaped connection plate may also be the negative electrode connection plate, and the positive electrode connection plate is provided on the pot-shaped negative electrode connection plate. That is, in the above embodiment, the electric polarities of the positive electrode connection plate 41 and the negative electrode connection plate 42 are reversed.

In addition, the first collision avoidance hole 410, the second collision avoidance hole 426 and the third collision avoidance hole 3121 overlap and communicate with each other. Projection planes of the connection and fixing tables 317, the three positive electrode connection terminals 419, the three negative electrode connection terminals 427, and the three single-phase connection terminals 445, which are perpendicular to the axial direction, are located inside a projection plane of the second collision avoidance hole 426 or the third collision avoidance hole 3121 perpendicular to the axial direction. The positive electrode connection terminals 419 are located on the positive electrode connection positions 319 and may be connected with the positive electrode connection positions 319 by screws. The negative electrode connection terminals 427 are located on the negative electrode connection positions 318 and may be connected with the negative electrode connection positions 318 by screws. The positive electrode connection terminals 419, the negative electrode connection terminals 427 and the single-phase terminals 445 are distributed circumferentially in sequence. The bent positive electrode connection terminals 419 fit with the inner edge of the second collision avoidance hole 426 and the connection and fixing platforms 317, for position limiting. The negative electrode connection positions 318 fit with the connection and fixing platforms 317, for position limiting. The fixing holes 3171 at one side of the respective negative electrode connection positions 318 are fixedly connected with the main circuit board. The motor controller further includes three Hall elements 46. One Hall element 46 is provided at one single-phase connection terminal 445. Pins of the Hall element 46 are also electrically connected with the main circuit board.

Referring to FIGS. 18 and 19 in combination with 17 and 20, when the motor controller 3 in the above state is mounted in the controller mounting chamber 122, the third collision avoidance hole 3121 is sleeved outside the central ring portion 211 and the magnetic ring 28. The positions of the second terminal portions 223 are aligned with the positions of the single-phase connection terminals 445 so as to facilitate the screw connection. The second terminal portions 223 pass through the respective Hall elements 46. The mounting shell 31 is mounted inside the ring wall 124 and fits therewith for position limiting. Monitoring sensors such as temperature sensors may be mounted in the motor mounting chamber. Wirings of the sensors are passed through the respective inserting holes 114 to be electrically connected with the motor controller. The power transistors 34 surround the main circuit board 43 and are close to and surround an outer circumference of the mounting shell 31. In addition, the controller cooling groove 132 surrounds the power transistors 34, so as to achieve rapid heat conduction.

The main circuit board 43 is provided with a connection position 431, a control circuit position 432, a first soldering position 433, and a second soldering position 434. The control circuit position 432, the first soldering position 433 and the second soldering position 434 are respectively configured in a ring shape. The connection position 431 is located in a center of the main circuit board 43. The control circuit position 432 surrounds the connection position 431. The first soldering position 433 surrounds the control circuit position 432. The second soldering position 434 surrounds the first soldering position 433. The second soldering position 434 is located at an outermost edge of the main circuit board 43. Projection planes of the positive electrode connection terminals 419, the negative electrode connection terminals 427 and the single-phase connection terminals 445, which are perpendicular to the axial direction, are located inside a projection plane of the connection position 431 perpendicular to the axial direction. The main circuit board 43 is provided with run-through collision avoidance holes corresponding to the positions of the positive electrode connection terminals 419, the negative electrode connection terminals 427, and the single-phase terminals 445. The positive electrode connection terminals 419, the negative electrode connection terminals 427 and the single-phase connection terminals 445 pass through the corresponding collision avoidance holes. The single-phase connection terminals 445 are electrically connected with the main circuit board 43. The multiple positive electrode pins 411, the multiple negative electrode pins 421 and the multiple single-phase pins 442 are electrically connected with the main circuit board 43 at the first soldering position 433. The multiple power transistors 34 are provided at an outer circumference of the main circuit board 43 and are electrically connected with the main circuit board 43 at the second soldering position 434. The multiple power transistors 34 are evenly distributed along the same circumferential direction of the main circuit board 43. The multiple power transistors 34 are circumferentially arranged and located outside the three-phase connection plate assembly 44, the negative electrode connection plate 42, and the positive electrode connection plate 41 along a radial direction thereof.

The multiple positive electrode pins 411, the multiple negative electrode pins 421 and the multiple single-phase pins 442 are arranged along the circumferential direction of the main circuit board 43. Two adjacent single-phase pins 442 form a single-phase bridge arm pin group. One single-phase bridge arm pin group, one positive electrode pin 411, and one negative electrode pin 421 are cyclically arranged in a circumferential direction of the laminated busbar assembly in sequence. A control circuit is provided at the control circuit position 432. A copper clad circuit is formed at a position of the control circuit, and a corresponding inverter circuit and a required circuit component are soldered with tin. The projection planes of the capacitors 45 perpendicular to the axial direction are located inside the projection plane of the control circuit position 432 perpendicular to the axial direction.

Referring to FIG. 9, a circumferential wall of the housing 1 located at the controller mounting chamber 122 is provided with a run-through connecting hole 138 along a radial direction of the housing. The drive assembly further includes a connecting assembly 5. The connecting assembly 5 includes a connecting sleeve 53, a positive electrode connecting plate 52 and a negative electrode connecting plate 51. The positive electrode connecting plate 52 and the negative electrode connecting plate 51 are each sheet-like. An inner connecting terminal portion of the positive electrode connecting plate 52 includes a positive electrode connecting base portion 523 and three positive electrode connecting portions 524. The three positive electrode connecting portions 524 are connected at an outer edge of the positive electrode connecting base portion 523. The three positive electrode connecting portions 524 are circumferentially evenly distributed at the outer edge of the positive electrode connecting base portion 523. The positive electrode connecting portions 524 each are provided with a connection hole. An inner connecting terminal portion of the negative electrode connecting plate 51 includes a negative electrode connecting base portion 513 and three negative electrode connecting portions 514. The three negative electrode connecting portions 514 are connected at an outer edge of the negative electrode connecting base portion 513. The three connecting portions 514 are circumferentially evenly distributed at the outer edge of the negative electrode connecting base portion 513. The negative electrode connecting portions 514 each are provided with a connection hole. The positive electrode connecting plate 52 and the negative electrode connecting plate 51 each are provided with an outer connecting terminal portion on an outer circumferential wall of the housing 1. A straight plate portion 521 is provided between the outer connecting terminal portion 522 of the positive electrode connecting plate 52 and one positive electrode connecting portion 524. A straight plate portion 511 is provided between the outer connecting terminal portion 512 of the negative electrode connecting plate 51 and one negative electrode connecting portion 514. The straight plate portion 511 and the straight plate portion 521 pass through the connecting hole 138 side by side.

In addition, the positive electrode connecting base portion 523 and the negative electrode connecting base portion 513 are laminated on the main circuit board 43 along the axial direction of the housing 1. The negative electrode connecting base portion 513 is located between the positive electrode connecting base portion 523 and the motor controller. A first collision avoidance recess 525 is formed between the positive electrode connecting base portion 523 and the positive electrode connecting portions 524. The negative electrode connecting base portion 513 is located in the first collision avoidance recess 525. The three positive electrode connection terminals 419 and the three negative electrode connection terminals 427 are located on a same radial plane. This facilitates the connection of the positive electrode connecting portions 524 with the positive electrode connection terminals 419 and the connection of the negative electrode connecting portions 514 with the negative electrode connection terminals 427. In order to improve the protection, the connecting sleeve 53 covers the positive electrode connecting plate 52 and the negative electrode connecting plate 51 by secondary injection molding, and the positive electrode connecting plate 52 and the negative electrode connecting plate 51, except for the outer connecting terminal portions, the negative electrode connecting portions and the positive electrode connecting portions, are wrapped. In addition, the connecting sleeve 53 is located in the controller mounting chamber 122, and the connecting sleeve 53 is in an interference fit with the connecting hole 138.

Of course, the following configuration may also be adopted to achieve the objectives of the present disclosure. The positive electrode connecting base portion 523 is located between the negative electrode connecting base portion 513 and the motor controller. A second collision avoidance recess is formed between the negative electrode connecting base portion 513 and the negative electrode connecting portions 514, and the positive electrode connecting base portion 523 is located in the second collision avoidance recess.

The connecting assembly 5 further includes a connecting box 55. The connecting box 55 is connected with the outer circumferential wall of the housing 1 located at the controller mounting chamber 122. An interior of the connecting box 55 communicates with the controller mounting chamber 122 through the connecting hole 138. The outer connecting terminal portion of the positive electrode connecting plate 52 and the outer connecting terminal portion of the negative electrode connecting plate 51 extend into the connecting box 55. The drive assembly is provided with a mounting orientation, and is mounted to a vehicle in the state shown in FIG. 18. Thus, in a vertical direction of the mounting orientation, the housing 1 includes a top portion and a bottom portion. In the vertical direction of the mounting orientation, the connecting hole 138 is located between the top portion and the bottom portion of the housing. Therefore, the connecting box 55 is also located between the top portion and the bottom portion of the housing, and the connecting box 55 is located on a lateral side, so as to reduce the occupied space in the vertical direction. Preferably, the straight plate portion 511 and the straight plate portion 521 run at an acute angle (for example, 45°) or a right angle with the vertical direction.

In the prior art, the rear end in an axial direction of the motor is generally provided with a fixing structure or a heat dissipation structure, which is generally implemented by multiple cylindrical structures. The present disclosure utilizes the space at the rear end in the axial direction, and arranges components such as the motor controller, the capacitors and the power transistors in the controller mounting chamber at the rear end in the axial direction. The present disclosure optimizes the connection structure of the rear end in the axial direction through the circuit arrangement of the laminated busbar, the terminal block and the annular arrangement of the power transistors, etc. In this way, the present disclosure reduces the overall occupied space of the circuit devices and effectively utilizes the space at the rear end in the axial direction. In addition, compared to the existing motor assembly, the present disclosure maintains the axial dimension of the drive assembly, and also maintains the radial dimension of the drive assembly in the vertical direction by optimized connection through the connecting hole. Overall, the present disclosure enables a highly integrated drive assembly.

Embodiment of Vehicle:

The vehicle includes the drive assembly as described above. The drive assembly may be integrated with or without a transmission. The vehicle may be a new energy electric car, a new energy electric bus, a new energy electric truck, a new energy electric cleaning vehicle, a new energy electric rail vehicle, a new energy electric flying vehicle, a new energy electric shipping vehicle, etc.

It can be seen from the above that, by utilizing the space at the rear end in the axial direction of the motor, through the arrangement of the partition wall and the bearing, the rotor is rotatably provided in the motor mounting chamber, and the motor controller is provided in the controller mounting chamber. Three single-phase terminals pass through the partition wall and are connected between the motor controller and the stator. The projection planes of the three single-phase terminals perpendicular to the axial direction are located between the projection plane of the bearing perpendicular to the axial direction and the projection plane of the stator perpendicular to the axial direction. When the terminals of the stator and the single-phase terminals are connected, that is, when the rotor is not mounted, an operating space is reserved between the bearing and the stator. This facilitates the connection of the terminals of the stator and the single-phase terminals. The motor controller is provided at the rear end in an axial direction of the motor, which effectively reduces the occupied space, improves the space utilization, and realizes the high integration of the drive assembly. The bearing is stably provided in the mounting ring wall, which improves the operational stability of the motor, and the three single-phase terminals are located at the outer circumferential wall of the mounting ring wall, which makes it convenient for the mounting and positioning of the terminals of the stator. The first collision avoidance grooves can position the terminals of the stator, and optimize the layout space, thereby improving the connecting easiness and reliability. The fixing holes are configured to attach and fix the motor controller. The connecting holes and the fixing holes are located between the bearing and the stator, which is convenient for disassembly and assembly. The second collision avoidance grooves can accommodate the leads and terminals of the stator, thereby optimizing the layout space.

In addition, considering that the stator has a three-phase winding, the three single-phase terminals are arranged in the outer circumference of the terminal block body to connect the terminals of the stator correspondingly, thereby optimizing the wiring layout. In addition, the space formed by the three single-phase terminals can accommodate components such as the bearing, thereby improving the compactness of the structure layout. The first terminal portions and the second terminal portions are respectively located outside or inside the wiring groove. The first terminal portions are circumferentially scattered to avoid the bearing, and the second terminal portions are circumferentially concentrated to achieve centralized connection of the motor controller and improve the circuit layout utilization of the motor controller. Through secondary injection molding, the central ring portion, the outer connecting portions and the inner connecting portions are wrapped around the single-phase terminals, thereby improving the protection between the two terminal portions. The central ring portion can also be used for the mounting and positioning of other devices. The outer connecting portions and the first terminal portions are located outside the central ring portion in an axial direction and protrude outwards in a radial direction to avoid the bearing or the resolver and improve the space utilization. The shielding walls can play a role of positioning and limiting for wiring to improve the connection stability, and also play a role of insulating the terminals of the stator. The three-phase terminal block is fixedly mounted in the drive assembly through the mounting portions, and one mounting portion is located beside one second terminal portion, which is convenient for assembly and disassembly. Since the terminal block body can be provided with devices such as the resolver, the magnetic ring is provided around the terminal block body to reduce electromagnetic interference.

The potting glue is filled on the end surface of the partition wall facing the motor mounting chamber, such that the potting glue covers the first terminal portions that are connected with the terminals of the stator. This realizes potting and sealing of the first terminal portions and the terminals of the stator, thereby effectively improving the protection and efficiently conducting the waste heat to the partition wall. The bearing is stably provided in the mounting ring wall, which improves the operational stability of the motor, and the three single-phase terminals are located on the outer circumferential wall of the mounting ring wall, which makes it convenient for the mounting and positioning of the terminals of the stator. In addition, the potting glue is accurately filled between the mounting ring wall, the partition wall and the inner wall of the housing, such that the waste heat generated by the bearing can also be conducted through the potting glue. The fixing holes are used to connect and fix the motor controller, and the connecting holes are used for the single-phase terminals to pass through, so as to improve the isolation between the motor mounting chamber and the controller mounting chamber and avoid mutual interference. The second collision avoidance grooves can accommodate the leads and terminals of the stator, thereby optimizing the layout space. In addition, the terminals and the leads of the stator, and an end of the winding are positioned by the potting glue.

The resolver is connected with the rotor and can monitor the rotation state of the rotor. The resolver is located at the side closer to the controller mounting chamber, allowing it to be routed to the motor controller. The chamber cover isolates the two chambers. The connection groove is easy for wiring, thereby improving the operation stability.

The liquid cooling channel of the housing communicates with the partition cooling grooves of the partition wall. Therefore, the waste heat of the bearing and some other components can be quickly transferred from the partition wall to the housing, thereby improving the heat conduction efficiency and the operating performance of the drive assembly. Since the partition wall needs to support the bearing and other devices, the partition wall needs a certain structural space. Thus, the partition cooling grooves are distributed circumferentially to improve the heat conduction efficiency of the partition wall without affecting the strength. The guide baffles are configured to guide the cooling liquid at the outer side from outer ends to inner ends of the partition cooling grooves, and the mounting grooves make it easy for the mounting and positioning of the guide baffles. The guide grooves at outer ends and the through holes in centers are designed to adjust the flow direction of the cooling liquid, so as to realize sufficient heat exchange and improve the thermal conductivity. Each partition cooling groove is provided with a larger open outer end and a smaller inner end, which enlarges the size of the channel and improves the heat dissipation performance while ensuring the structural strength of the inner end of the partition wall. The casing realizes the relative airtightness of the partition cooling grooves and the liquid cooling channel, which facilitates the processing of the grooves and the channel, and improves the processing efficiency and the heat dissipation efficiency of the channel. The motor cooling groove is mainly used to dissipate the waste heat generated by the motor, and the controller cooling groove is mainly used to dissipate the waste heat generated by the motor controller. The partition cooling grooves communicate with the motor cooling groove and the controller cooling groove. Therefore, the liquid cooling scheme of the integrated heat dissipation channel improves the heat dissipation efficiency and the performance of the drive assembly. Since the partition wall needs to support the bearing and other devices, the partition wall needs a certain structural space. Thus, the partition cooling grooves are distributed circumferentially to improve the heat conduction efficiency of the partition wall without affecting the strength. The guide baffles are configured to guide the cooling liquid at the outer side from outer ends to inner ends of the partition cooling grooves, so as to realize sufficient heat exchange and improve the thermal conductivity.

The multiple power transistors are circumferentially arranged and connected with the inner wall of the controller mounting chamber. The waste heat of the power transistors can be efficiently conducted to the interconnected controller cooling groove and motor cooling groove, realizing integrated liquid cooling and improving heat dissipation efficiency. Besides, using the inner circumferential wall as a heat conductor can effectively optimize the device layout of the motor controller, avoid the need for a heat conduction structure, and facilitate the highly integrated design of the device. The power transistors are turned on by time sharing in actual operation. Therefore, the distributed arrangement realizes time-sharing heat conduction at different positions, thereby further improving the heat conduction efficiency. The heat-conducting surfaces are closely adjacent to the packages of the power transistors, which increases the heat conduction area and improves the heat conduction efficiency. The collision avoidance grooves are easy for the processing of the heat-conducting surface, and a certain collision avoidance space is formed between two power transistors. The heat-conducting sheets may be made of thermally conductive silicone or a thermally conductive ceramic plate, which improves the heat conduction efficiency between the packages of the power transistors and the heat-conducting surfaces. The power transistor mounting groove positions and limits the power transistors. The positioning frame provided in the power transistor mounting groove limits the power transistors, so as to effectively improve the mounting stability of the power transistors. This design improves the performance stability of the drive assembly that is located in a severe vibration environment.

The three single-phase connection plates are coplanar and form a circle-like outline. The positive electrode connection plate, the negative electrode connection plate and the three single-phase connection plates are laminated, and are electrically connected with the main circuit board through the pins at their respective outer edges, so as to realize the corresponding circuit connection. The laminated structure reduces the axial dimension and achieves a compact purpose, and the laminated structure is simple and is easy for assembly, thereby improving assembly efficiency. The arrangement of the pins in the same circumferential direction optimizes the wiring layout and the circuit layout of the main circuit board. The collision avoidance grooves make it easy for the pins to be arranged in the same circumferential direction, and can achieve the corresponding limiting purpose. The collision avoidance holes are centrally provided, and the arcuate single-phase connection plates in a circle form a connecting space at a center. Thus, the projection planes of the positive electrode connection terminals, the negative electrode connection terminals, and the three single-phase connection terminals, which are perpendicular to the axial direction, are located inside the projection plane of the second collision avoidance hole perpendicular to the axial direction. The positive electrode connection terminals, negative electrode connection terminals and single-phase connection terminals are centrally arranged, which is convenient for connection, and the pins are arranged circumferentially, which effectively optimizes the circuit wiring layout.

The positive electrode connection plate is a bottomed cylinder, which accommodates the multiple capacitors and realizes effective positioning of the capacitors. In addition, the negative electrode connection plate plays the role of covering and positioning, which provides desired support for the stable connection of the capacitors. The main circuit board, the negative electrode connection plate, the multiple capacitors and the positive electrode connection plate are laminated in sequence. The laminated structure reduces the axial dimension and achieves the compact purpose, and the laminated structure is simple and is easy for assembly, improving assembly efficiency. The first collision avoidance hole is used for mounting, positioning and placement of terminals. The annular device accommodating space is used to hold the multiple capacitors, such that the multiple capacitors are distributed circumferentially and well supported and positioned. The axially arranged electrical contacts are respectively electrically connected with the two ends of the capacitor to ensure the electrical connection stability. The negative electrode connection plate is stably provided on the supporting platform, and the positive electrode connection terminals and the negative electrode connection terminals are located in the second collision avoidance hole. This design realizes the centralized arrangement of terminals, optimizes the layout, and improves the connection efficiency. The mounting shell and the positioning post assembly provide stable support and fixation for the main circuit board, the positive electrode connection plate, the negative electrode connection plate, and even the motor controller. The third collision avoidance hole of the mounting shell is used for assembly and positioning of other equipment. The connection and fixing platforms provide stable support for the connection of the positive electrode and negative electrode. The positioning posts provide support and positioning for the main circuit board, the positive electrode connection plate and the negative electrode connection plate. A capacitor positioning space is formed by four positioning posts, which provides stable support for the connection of the capacitors and ensures the stability of the motor controller. The radial arrangement of the first positioning posts and the second positioning posts is adapted to the arrangement direction of the capacitors which are arranged circumferentially, thereby further positioning the capacitors and improving the stability of the capacitors.

To hold the annularly arranged multiple power transistors at the same time through the annular base portion and the circumferentially distributed holding portions, the holding member is placed in a preset position, which realizes simple assembly and quick positioning. The manufacturing, forming, assembling and positioning of the sheet-like holding member are relatively simple. The abutting portions protrude outwards and are configured in an arc shape to provide a stable force for holding the power transistors. Two adjacent holding portions form a device holding group for holding one power transistor. One first slot maintains the same holding force of two holding portions, and one second slot separates two adjacent device holding groups. This design enables the device holding groups to have a large offset space, and with the help of the annular base portion, the device holding groups can well hold the power transistors.

The connection position, the control circuit position, the first soldering position, and the second soldering position are sequentially arranged from a center to an outer side of the main circuit board along a radial direction of the main circuit board. The control circuit position, the first soldering position and the second soldering position are respectively configured in a ring shape. The connection terminals are centrally arranged, and the central control circuit has a relatively large space. The annular circuit layout improves the structural coordination with the drive assembly.

The positive electrode connecting plate and the negative electrode connecting plate pass through the circumferential wall along the radial direction, making full use of the space in the horizontal direction and reducing the space occupied in the vertical direction or the axial direction. The sheet-like connecting plates are easy for positioning and mounting, and further facilitate the layout of the axial space. The arrangement of the three positive electrode connection terminals and the three negative electrode connection terminals facilitates the annular circuit layout of the motor controller. Correspondingly, the connecting plates are each provided with three connecting portions in a circumferential direction. The connecting base portions are used for bearing and connection, and provide stable support and fixation for the connecting plates through triangular positioning. The laminated arrangement improves the compactness of the structural arrangement. In order to solve the interference problem caused by the laminated arrangement, collision avoidance recesses are provided. Through the reasonable structural arrangement, the positive electrode connecting plate and the negative electrode connecting plate are laminated without interfering with each other. The insulation design of the connecting sleeve improves the protection and safety of the connecting plate. The connecting box provided on the radial outer circumferential wall facilitates the connection of the positive electrode and negative electrode of the battery without opening the motor mounting chamber. The outlet direction of the positive electrode connecting plate and the negative electrode connecting plate is designed based on the mounting orientation of the drive assembly. In order to shorten the vertical dimension such that the vehicle has more vertical space at the drive assembly, the connecting holes are located between the top portion and the bottom portion of the housing, and the positive electrode connecting plate and the negative electrode connecting plate are inclined to the vertical direction.

INDUSTRIAL APPLICABILITY

The laminated busbar assembly, the motor controller, the drive assembly and the vehicle of the present disclosure are suitable for the field of new energy. The present disclosure utilizes the space at the rear end in the axial direction of the motor, and through the arrangement of the partition wall and the bearing, the rotor is rotatably provided in the motor mounting chamber, while the motor controller is provided in the controller mounting chamber. By laminating the busbar and the devices, the present disclosure effectively reduces the occupied space, improves the space utilization, and realizes high integration.

The invention claimed is:

1. A motor controller with an annular circuit layout, comprising a laminated busbar assembly and multiple power transistors, wherein
the laminated busbar assembly comprises a main circuit board, a positive electrode connection plate, a negative electrode connection plate, and a three-phase connection plate assembly; the main circuit board, the positive electrode connection plate and the negative electrode connection plate are each circular; an outer edge of the positive electrode connection plate is provided with multiple positive electrode pins in a circumferential direction of the positive electrode connection plate, and an outer edge of the negative electrode connection plate is provided with multiple negative electrode pins in a circumferential direction of the negative electrode connection plate; the three-phase connection plate assembly comprises three single-phase connection plates, which are each arcuate; and an outer edge of each of the single-phase connection plates is provided with multiple single-phase pins in a circumferential direction of the each of the single-phase connection plates;
a center of the positive electrode connection plate is provided with a first collision avoidance hole and an inner edge of the positive electrode connection plate is provided with positive electrode connection terminals; a center of the negative electrode connection plate is provided with a second collision avoidance hole and an inner edge of the negative electrode connection plate is provided with negative electrode connection terminals; and an inner edge of each of the single-phase connection plates is provided with a single-phase connection terminal;
the main circuit board, the three-phase connection plate assembly, the negative electrode connection plate and the positive electrode connection plate are laminated in sequence along an axial direction of the motor controller; and the three single-phase connection plates are coplanar;
the main circuit board is provided with a connection position, a control circuit position, a first soldering position, and a second soldering position; the connection position is located in a center of the main circuit board; the control circuit position surrounds the connection position; the first soldering position surrounds the control circuit position; and the second soldering position surrounds the first soldering position; and
projection planes of the positive electrode connection terminals, the negative electrode connection terminals, and the single-phase connection terminals, which are perpendicular to an axial direction of the motor controller, are located inside a projection plane of the connection position perpendicular to the axial direction; the multiple positive electrode pins, the multiple negative electrode pins and the multiple single-phase pins are electrically connected with the main circuit board at the first soldering position; and multiple power transistors surround the main circuit board, and are electrically connected with the main circuit board at the second soldering position.

2. The motor controller according to claim 1, wherein the multiple power transistors are evenly distributed along a same circumferential direction of the main circuit board.

3. The motor controller according to claim 1, wherein the multiple positive electrode pins, the multiple negative electrode pins and the multiple single-phase pins are arranged along a same circumferential direction of the main circuit board.

4. The motor controller according to claim 1, wherein the motor controller comprises multiple capacitors, which are located and connected between the negative electrode connection plate and the positive electrode connection plate.

5. The motor controller according to claim 4, wherein projection planes of the capacitors perpendicular to the axial direction are located inside a projection plane of the control circuit position perpendicular to the axial direction.

6. The motor controller according to claim 1, wherein the three single-phase connection terminals are circumferentially evenly distributed; and the motor controller further comprises three Hall elements, which are provided at the three single-phase connection terminals, respectively.

7. The motor controller according to claim 6, wherein one positive electrode connection terminal and one negative electrode connection terminal are located between two adjacent single-phase connection terminals.

8. The motor controller according to claim 7, wherein the positive electrode connection plate is provided with three positive electrode connection terminals, and the negative electrode connection plate is provided with three negative electrode connection terminals; and the positive electrode connection terminals and the negative electrode connection terminals are alternated circumferentially.

9. A drive assembly, comprising the motor controller according to claim 1.

10. A vehicle, comprising the drive assembly according to claim 9.

11. The motor controller according to claim 2, wherein the three single-phase connection terminals are circumferentially evenly distributed; and the motor controller further comprises three Hall elements, which are provided at the three single-phase connection terminals, respectively.

12. The motor controller according to claim 3, wherein the three single-phase connection terminals are circumferentially evenly distributed; and the motor controller further comprises three Hall elements, which are provided at the three single-phase connection terminals, respectively.

13. The motor controller according to claim 4, wherein the three single-phase connection terminals are circumferentially evenly distributed; and the motor controller further comprises three Hall elements, which are provided at the three single-phase connection terminals, respectively.

14. The motor controller according to claim 5, wherein the three single-phase connection terminals are circumferentially evenly distributed; and the motor controller further comprises three Hall elements, which are provided at the three single-phase connection terminals, respectively.

15. The motor controller according to claim 11, wherein one positive electrode connection terminal and one negative electrode connection terminal are located between two adjacent single-phase connection terminals.

16. The motor controller according to claim 12, wherein one positive electrode connection terminal and one negative electrode connection terminal are located between two adjacent single-phase connection terminals.

17. The motor controller according to claim 13, wherein one positive electrode connection terminal and one negative electrode connection terminal are located between two adjacent single-phase connection terminals.

18. The motor controller according to claim 14, wherein one positive electrode connection terminal and one negative electrode connection terminal are located between two adjacent single-phase connection terminals.

19. The motor controller according to claim 15, wherein the positive electrode connection plate is provided with three positive electrode connection terminals, and the negative electrode connection plate is provided with three negative electrode connection terminals; and the positive electrode connection terminals and the negative electrode connection terminals are alternated circumferentially.

20. The motor controller according to claim 16, wherein the positive electrode connection plate is provided with three positive electrode connection terminals, and the negative electrode connection plate is provided with three negative electrode connection terminals; and the positive electrode connection terminals and the negative electrode connection terminals are alternated circumferentially.

21. The motor controller according to claim 17, wherein the positive electrode connection plate is provided with three positive electrode connection terminals, and the negative electrode connection plate is provided with three negative electrode connection terminals; and the positive electrode connection terminals and the negative electrode connection terminals are alternated circumferentially.

22. The motor controller according to claim 18, wherein the positive electrode connection plate is provided with three positive electrode connection terminals, and the negative electrode connection plate is provided with three negative electrode connection terminals; and the positive electrode connection terminals and the negative electrode connection terminals are alternated circumferentially.

* * * * *